(12) United States Patent
Atwater et al.

(10) Patent No.: US 11,563,134 B2
(45) Date of Patent: Jan. 24, 2023

(54) SYSTEMS AND METHODS FOR THREE-TERMINAL TANDEM SOLAR CELLS

(71) Applicant: California Institute of Technology, Pasadena, CA (US)

(72) Inventors: Harry A. Atwater, South Pasadena, CA (US); Phillip R. Jahelka, Altadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 17/379,719

(22) Filed: Jul. 19, 2021

(65) Prior Publication Data

US 2022/0020891 A1    Jan. 20, 2022

Related U.S. Application Data

(60) Provisional application No. 63/054,087, filed on Jul. 20, 2020.

(51) Int. Cl.
| | |
|---|---|
| *H01L 31/0725* | (2012.01) |
| *H01L 31/073* | (2012.01) |
| *H01L 31/0216* | (2014.01) |
| *H01L 31/0735* | (2012.01) |
| *H01L 31/0224* | (2006.01) |
| *H01L 31/0687* | (2012.01) |
| *H01L 31/0693* | (2012.01) |

(52) U.S. Cl.
CPC .... *H01L 31/0725* (2013.01); *H01L 31/02168* (2013.01); *H01L 31/022425* (2013.01); *H01L 31/0687* (2013.01); *H01L 31/0693* (2013.01); *H01L 31/073* (2013.01); *H01L 31/0735* (2013.01)

(58) Field of Classification Search
CPC ....... H01L 31/02168; H01L 31/022425; H01L 31/0687; H01L 31/0693; H01L 31/0725; H01L 31/073; H01L 31/0735
See application file for complete search history.

(56) References Cited

U.S. PATENT DOCUMENTS

| | | | | |
|---|---|---|---|---|
| 4,387,265 A * | 6/1983 | Dalal | .................... | H01L 31/076 136/258 |
| 4,513,168 A * | 4/1985 | Borden | ............... | H01L 31/0687 136/244 |
| 4,536,607 A * | 8/1985 | Wiesmann | .......... | H01L 31/0749 136/258 |
| 4,575,576 A * | 3/1986 | Ludowise | ........... | H01L 31/0687 136/244 |

(Continued)

OTHER PUBLICATIONS

Martí et al., "Operation of the Three Terminal Heterojunction Bipolar Transistor Solar Cell", Physica Status Solidi C, Special Issue: E-MRS 2017 Spring Meeting, Symposium E ; E-MRS 2017 Spring Meeting, Symposium N, Oct. 2017, vol. 14, No. 10, doi: 10.1002/pssc.201700191.

(Continued)

*Primary Examiner* — Golam Mowla
(74) *Attorney, Agent, or Firm* — KPPB LLP

(57) ABSTRACT

Systems and methods of three-terminal tandem solar cells are described. Three-terminal metal electrodes can be formed to contact subcells of the tandem solar cell. The three-terminal tandem cell can improve the device efficiency to at least 30%.

24 Claims, 14 Drawing Sheets

(56) References Cited

U.S. PATENT DOCUMENTS

| | | | | | |
|---|---|---|---|---|---|
| 4,575,577 | A | * | 3/1986 | Fraas | H01L 31/0687 |
| | | | | | 257/E31.022 |
| 4,771,321 | A | * | 9/1988 | Lewis | H01L 31/184 |
| | | | | | 257/184 |
| 5,391,896 | A | * | 2/1995 | Wanlass | H01L 31/0687 |
| | | | | | 257/85 |
| 8,916,769 | B2 | * | 12/2014 | Hovel | B82Y 20/00 |
| | | | | | 136/255 |
| 2003/0070707 | A1 | * | 4/2003 | King | H01L 31/02168 |
| | | | | | 136/255 |
| 2004/0065363 | A1 | * | 4/2004 | Fetzer | H01L 21/02543 |
| | | | | | 257/E21.112 |
| 2004/0200523 | A1 | * | 10/2004 | King | H01L 31/0687 |
| | | | | | 136/262 |
| 2005/0150542 | A1 | * | 7/2005 | Madan | H01L 31/043 |
| | | | | | 257/E25.007 |
| 2009/0229658 | A1 | * | 9/2009 | Stan | H01L 31/0735 |
| | | | | | 136/255 |
| 2010/0051090 | A1 | * | 3/2010 | Lee | H01L 31/043 |
| | | | | | 136/246 |
| 2011/0017298 | A1 | * | 1/2011 | Lee | H01L 31/043 |
| | | | | | 438/95 |
| 2017/0110614 | A1 | * | 4/2017 | Derkacs | H01L 31/0687 |
| 2017/0110615 | A1 | * | 4/2017 | Derkacs | H01L 31/1844 |

OTHER PUBLICATIONS

Martí et al., "Three-terminal heterojunction bipolar transistor solar cell for high-efficiency photovoltaic conversion", Nature Communications, Apr. 22, 2015, vol. 6, No. 6902.

* cited by examiner

| 50 nm 5E18 n-GaAs |
| --- |
| 20 nm 1E18 n-GaInP |
| 5 nm undoped GaInP |
| 75 nm 1E18 n-GaAs |
| 1.75 um undoped GaAs |
| 75 nm 1E18 p-GaAs |
| 5 nm undoped GaInP |
| 20nm 1E18 p-GaInP |
| 300nm 1E20 p-AlGaAs |
| 250 nm 1E18 p-AlInP |
| 5 nm undoped AlInP |
| 75 nm 1E18 p-GaInP |
| 2.75 um undoped GaInP |
| 75 nm 1E18 n-GaInP |
| 5 nm undoped AlInP |
| 30 nm 1E18 n-AlInP |
| 50 nm 5E18 n-GaAs |
| 25nm $TiO_2$, 25nm $Si_3N_4$, 75nm $SiO_2$ |

FIG. 7A

SYSTEMS AND METHODS FOR THREE-TERMINAL TANDEM SOLAR CELLS

CROSS-REFERENCE TO RELATED APPLICATIONS

The current application claims the benefit of and priority under 35 U.S.C. § 119 (e) to U.S. Provisional Patent Application No. 63/054,087 entitled "Three-Terminal GaAs/GaInP Tandem Solar Cell" filed Jul. 20, 2020. The disclosure of U.S. Provisional Patent Application No. 63/054,087 is hereby incorporated by reference in its entirety for all purposes.

FIELD OF THE INVENTION

The present invention generally relates to systems and methods for three-terminal tandem solar cells; and more particularly to systems and methods for tandem solar cells with metal contacts to each subcell.

BACKGROUND

Stacking solar cells on top of each other can increase the solar panel overall efficiency, where each solar cell absorbs the light that it is most efficient at converting into electricity. The unit of stacked solar cells can be a tandem cell. The III-V semiconductors such as GaAs, AlGaAs, and GaInP are uniquely suited to making tandems because they can be grown directly on top of each other at high quality, and their optoelectronic properties can be fine-tuned by controlling the alloy compositions.

BRIEF SUMMARY OF THE INVENTION

Systems and methods in accordance with various embodiments of the invention enable the design and/or fabrication of multi-terminal tandem solar cells. Many embodiments provide tandem solar cells with at least three terminals. In some embodiments, each subcell of the multi-terminal tandem solar cells can be independently controlled by an electrode. Several embodiments provide three-terminal tandem solar cells with two subcells. A number of embodiments provide four-terminal tandem solar cells with three subcells. In many embodiments, tandem solar cells include semiconductor materials from the III and V columns of the periodic table including (but not limited to): gallium arsenide (GaAs), aluminum gallium arsenide (AlGaAs), and gallium indium phosphide (GaInP). Several embodiments include GaInP solar cell as the top cell and GaAs solar cell as the bottom cell of the three-terminal tandem solar cells. The multi-terminal tandem solar cells in accordance with many embodiments eliminate the current matching constraint between the subcells in traditional tandem solar cells. Several embodiments provide that the three-terminal tandem solar cells can eliminate the parasitic tunnel junction by inverting one of the subcells and electrically contacting the middle of the tandem solar cell with metal contacts. By introducing a third electrode, the voltage and/or current across each subcell can be independently controlled in accordance with some embodiments. Therefore, the subcells may not need to be current-matched, which enable a thicker GaInP top cell that can fully utilize its high open-circuit voltage. The efficiency of the three-terminal tandem solar cells in accordance with several embodiments can be at least 30%. Certain embodiments provide four-terminal tandem solar cells can include InGaAs, GaAs, and GaInP subcells, and four terminals that can run each of subcell independently.

One embodiment of the invention includes a three-terminal tandem solar cell, comprising:
at least one top cell;
at least one window layer on a first side of the top cell and at least one window layer on a second side of the top cell, wherein the second side is on the opposite side of the first side of the top cell;
at least one transparent conductor layer, wherein the at least one transparent conductor layer is deposited on the at least one window layer on the second side of the top cell;
at least one bottom cell;
at least one window layer on a first side of the bottom cell and at least one window layer on a second side of the bottom cell, wherein the second side is on the opposite side of the first side of the bottom cell, wherein the at least one widow layer on the first side of the bottom cell is deposited on the at least one transparent conductor layer;
at least one top electrode on the at least one window layer on the first side of the top cell;
at least one bottom electrode on the at least one window layer on the second side of the bottom cell;
at least one middle electrode on the at least one transparent conductor layer.

In another embodiment, the at least one top cell comprises at least one layer of undoped GaInP, at least one layer of p-type doped GaInP, and at least one layer of n-type doped GaInP, wherein the at least one top cell has a thickness of at least 2.75 microns.

In a further embodiment, the at least one window layer on the first side of the top cell comprises at least one layer of undoped AlInP, and at least one layer of n-type doped AlInP.

In an additional embodiment, the at least one window layer on the second side of the top cell comprises at least one layer of undoped AlInP, and at least one layer of p-type doped AlInP.

In still another embodiment, the transparent conductor layer comprises $Al_xGa_{1-x}As$, wherein x is about 0.4.

In a yet further embodiment, the at least one bottom cell comprises at least one layer of undoped GaAs, at least one layer of p-type doped GaAs, and at least one layer of n-type doped GaAs, wherein the at least one top cell has a thickness of at least 1.75 microns.

In a still further embodiment, the at least one window layer on the first side of the bottom cell comprises at least one layer of undoped GaInP, and at least one layer of p-type doped GaInP.

In yet another additional embodiment, the at least one window layer on the second side of the bottom cell comprises at least one layer of undoped GaInP, and at least one layer of n-type doped GaInP.

In a further embodiment again, the top electrode comprises AuPdGe.

In another additional embodiment, the middle electrode comprises gold, silver, AuZn, or Ti/Pt/Au.

In a still yet further embodiment, the bottom electrode comprises AuGeNi, CuGe, or PdGe.

Still another embodiment includes a first contact layer between the at least one window layer on the first side of the top cell and the at least one top electrode, a second contact layer between the at least one window layer on the second side of the bottom cell and the at least one bottom electrode.

Yet another further embodiment includes an anti-reflection layer covering the at least one window layer on the first side of the top cell and the at least one top electrode.

A further still embodiment again includes a mechanical handle layer covering the at least one window layer on the second side of the bottom cell and the at least one bottom electrode.

In a further embodiment again, the first contact layer comprises GaAs, and the second contact layer comprises GaAs.

In yet another additional embodiment, the anti-reflection layer comprises $TiO_2$, $Si_3N_4$, $SiO_2$, and any combinations thereof.

In a yet further embodiment, the mechanical handle layer comprises a polyimide or a silicone.

A still further embodiment again includes a method of fabricating a three-terminal tandem solar cell comprising:
  providing a wafer substrate;
  depositing a release layer on one side of the wafer substrate, wherein the release layer comprises $Al_xGa_{1-x}As$ and x is greater than 0.6;
  growing a stack of tandem solar cell on the release layer, wherein the stack comprising:
    at least one top cell;
    at least one window layer on a first side of the top cell and at least one window layer on a second side of the top cell, wherein the second side is on the opposite side of the first side of the top cell;
    at least one transparent conductor layer, wherein the at least one transparent conductor layer is deposited on the at least one window layer on the second side of the top cell;
    at least one bottom cell;
    at least one window layer on a first side of the bottom cell and at least one window layer on a second side of the bottom cell, wherein the second side is on the opposite side of the first side of the bottom cell, wherein the at least one widow layer on the first side of the bottom cell is deposited on the at least one transparent conductor layer;
  depositing at least one bottom electrode on the at least one window layer on the second side of the bottom cell;
  coating a photomask with at least one slit on the at least one bottom electrode;
  etching the at least one bottom cell and the window layers on the first and second side of the bottom cell through the at least one slit of the photomask;
  depositing at least one middle electrode on the at least one transparent conductor layer;
  removing the photomask;
  depositing a mechanical handle layer covering the at least one bottom electrode, the at least one middle electrode and the bottom cell;
  etching the release layer to remove the wafer substrate; and,
  depositing at least one top electrode on the at least one window layer on the first side of the top cell.

Another yet further embodiment includes depositing an anti-reflection layer covering the at least one top electrode and the at least one window layer on the first side of the top cell.

Yet another embodiment again includes depositing a contact layer on the at least one window layer on the first side of the top cell before depositing the at least one top electrode.

Another further embodiment includes etching the contact layer after depositing the at least one top electrode.

In still another further embodiment again, the stack of tandem solar cell is grown on the release layer via metalorganic chemical vapor deposition, hydride vapor phase epitaxy, liquid phase epitaxy, or molecular beam epitaxy.

In yet another embodiment, an etchant for the etching of the release layer is HF.

In another yet further embodiment, the deposition of the at least one bottom electrode is via shadow mask or photolithography.

Additional embodiments and features are set forth in part in the description that follows, and in part will become apparent to those skilled in the art upon examination of the specification or may be learned by the practice of the disclosure. A further understanding of the nature and advantages of the present disclosure may be realized by reference to the remaining portions of the specification and the drawings, which forms a part of this disclosure

BRIEF DESCRIPTION OF THE DRAWINGS

The description will be more fully understood with reference to the following figures, which are presented as exemplary embodiments of the invention and should not be construed as a complete recitation of the scope of the invention, wherein:

FIGS. 7A-7B illustrate structures of a three-terminal tandem solar cell used in performance simulation in accordance with an embodiment of the invention.

DETAILED DESCRIPTION OF THE INVENTION

Figure 1:
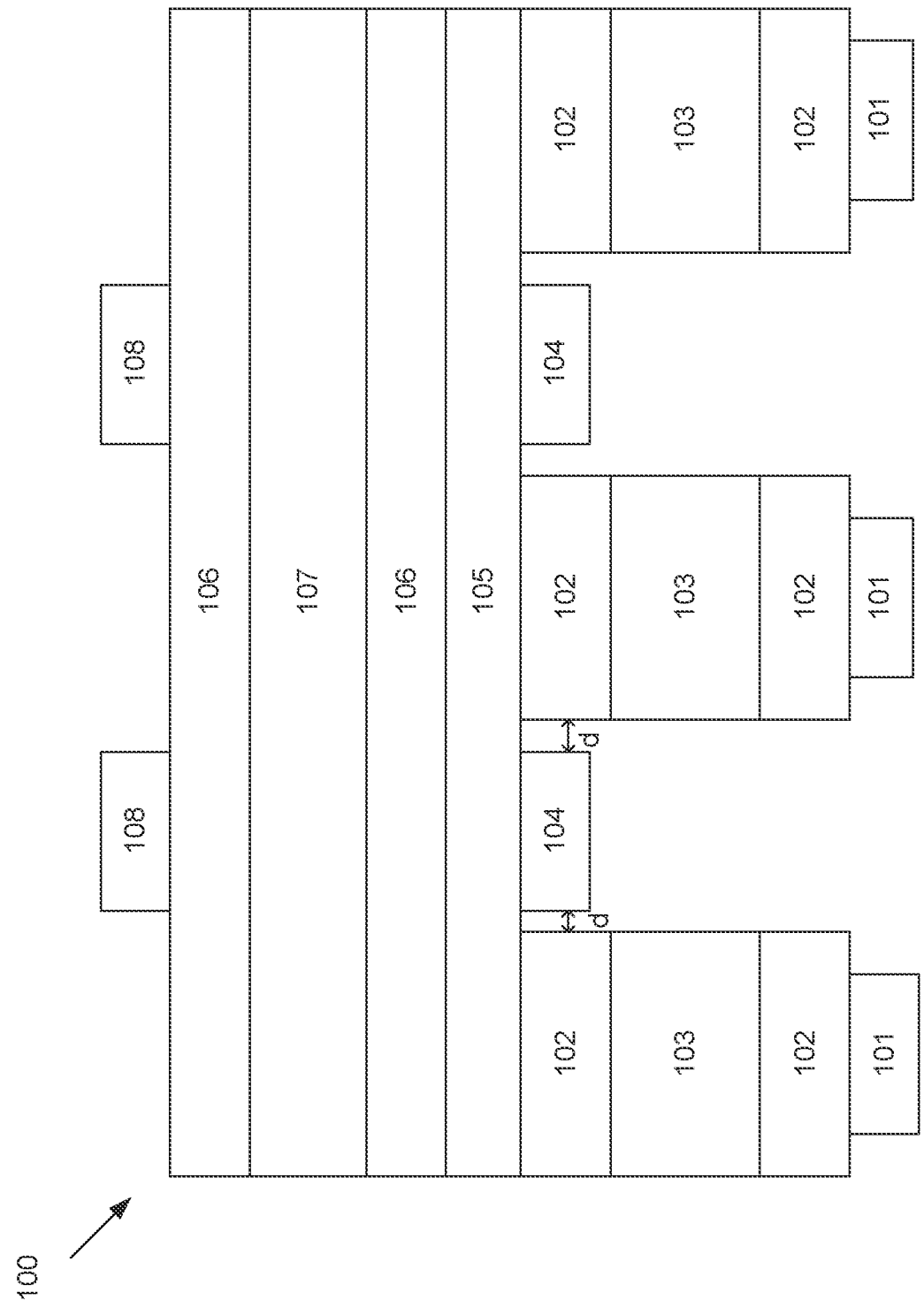
FIG. 1 illustrates a three-terminal tandem solar cell structure in accordance with an embodiment of the invention.

Turning now to the drawings, tandem solar cells with multi-terminal electrical contacts in accordance with various embodiments are illustrated. Many embodiments provide tandem solar cells with at least three terminals. In some embodiments, each subcell of the multi-terminal tandem solar cells can be independently controlled by a terminal. Several embodiments provide three-terminal tandem solar cells with two subcells. A number of embodiments provide four-terminal tandem solar cells with three subcells. Many embodiments implement tandem solar cells with semiconductor materials from the III and V groups of the periodic table. Semiconductor materials of tandem solar cells include (but are not limited to): gallium arsenide (GaAs), aluminum gallium arsenide (AlGaAs), and gallium indium phosphide (GaInP). In several embodiments, the tandem solar cells include GaInP top cells and GaAs bottom cells. Many embodiments implement window layers and/or back-surface-field (bsf) layers for top cells and bottom cells of the three-terminal tandem solar cells. The window layers and/or bsf layers can include (but are not limited to) undoped semiconductors, n-type doped semiconductors, and p-type doped semiconductors. In the three-terminal tandem solar cells, different window and/or bsf layers to the top and bottom cells respectively can be implemented in accordance with certain embodiments. Many embodiments provide that the different window and/or bsf layers designed in the three-terminal tandem solar cells can facilitate the deposition of metal electrodes on both sides of the tandem cells. Different window and/or bsf layers can control the etching process and hence facilitate the metal electrodes deposition.

In many embodiments, the three-terminal tandem solar cells implement thin films as the substrate. Some embodiments provide that the three-terminal tandem solar cells eliminate wafers such as GaAs wafers as the substrate. Three-terminal tandem solar cells using thin films as the substrate in accordance with many embodiments provide advantages including (but not limited to) lighter weight, high efficiency, and lower cost. Eliminating the wafer substrate can make the three-terminal tandem solar cells lighter in weight, which can be advantageous for aerospace applications and/or space solar cell applications. In addition, thin film based three-terminal tandem solar cells can implement photon recycling processes in the III-V semiconductor solar cells, hence providing higher efficiency in electricity conversion. Furthermore, wafer substrates can be costly. It can reduce fabrication costs by recycling the wafer substrates during the three-terminal tandem solar cell fabrication process. In certain embodiments, the three-terminal tandem solar cells with thin film substrate can have electrodes deposited on both sides of the tandem cells. Tandem cells with a wafer substrate may not have electrodes on the back side of the solar cells. Many embodiments provide that using three terminals in tandem solar cells makes it robust to changes in the solar spectrum. Thinned GaInP and/or GaAs cells may work best for one solar spectrum. While the solar spectrum changes throughout the day, the three-terminal tandem solar cells in accordance with several embodiments may not suffer problems due to this.

Tandem solar cell with three-terminal metal contacts in accordance with many embodiments can eliminate the current matching constraint between the subcells and the parasitic tunnel junction in traditional tandem cell designs. Several embodiments invert one of the subcells and deposit electrical contacts to the middle of the tandem cell. In some embodiments, the three-terminal contacts enable independent control of the voltage and/or current across each subcell, hence the subcells may not need to be current-matched.

Many embodiments provide fabrication methods of three-terminal tandem solar cells. In several embodiments, the tandem solar cell can be grown upside down on a wafer substrate with a release layer. Some embodiments provide that the release layer can be etched away to release the wafer substrate such that the tandem cells would be based on thin films. In certain embodiments, the stack of tandem cells can be photolithographically patterned with slits and etched in etchants. Selective etchants in accordance with embodiments can etch the phosphides and the arsenides selectively. The etching process can create a trench to form the middle electrodes.

Systems and methods for tandem solar cells with three-terminal metal contacts in accordance with various embodiments of the invention are discussed further below.

Tandem Solar Cells

Stacking solar cells on top of each other can increase solar panel efficiency. Each solar cell in the stack primarily absorbs the wavelength of light that the solar cell is most efficient at converting into electricity. The unit of stacked solar cells can be called a tandem cell in accordance with embodiments. The III-V semiconductors such as gallium arsenide (GaAs), aluminum gallium arsenide (AlGaAs), and gallium indium phosphide (GaInP) may be uniquely suited to making tandems because they can be grown directly on top of each other. The III-V semiconductors in the tandem cells can be fabricated at high quality using techniques such as metalorganic chemical vapor deposition (MOCVD) or molecular beam epitaxy (MBE). The optoelectronic properties of the semiconductors can be fine-tuned by controlling their alloy compositions. III-V semiconductor solar cells have great efficiency for both single cells and tandems.

A traditional III-V, two-cell tandem can be a GaInP top cell grown on top of a GaAs bottom cell with a tunnel-junction interconnect and metal contacts on the top and bottom. GaAs and GaInP are chosen because each subcell individually performs well, and GaAs and GaInP have the same lattice constant such that they can be grown directly on top of each other. One limitation of the design is that the subcell that produces the least amount of electrical current can limit the current of the overall tandem. If both subcells have thickness that are optically thick, the GaInP subcell may absorb about 19.5 $mAcm^{-2}$ of photocurrent, while the GaAs subcell may only absorb about 12.6 $mAcm^{-2}$, which negatively limits overall device performance. To circumvent this limitation, the GaInP top cell can be thinned so that some light it absorbs can reach the GaAs bottom cell. Such an approach may achieve current matching within the subcells, but at the cost of not taking full advantage of the GaInP subcell's higher open-circuit voltage. In addition, the tunnel junction interconnect between the top cell and the bottom cell can introduce parasitic optical absorption and the tunnel junction interconnect may be difficult to fabricate.

Many embodiments provide three-terminal tandem solar cell structures that can achieve high overall efficiencies. In some embodiments, the three-terminal tandem solar cells include GaInP top cells and GaAs bottom cells. In several embodiments, the three-terminal tandem solar cells can eliminate the current matching constraint between subcells. In some embodiments, the three-terminal tandem solar cells can eliminate the parasitic tunnel junction. The three-terminal tandem solar cells in accordance with certain embodiments have electrical contacts including (but not limited to) metal contacts on the top and the bottom of the tandem cell, as well as electrical contacts to the middle of the tandem cells. Some embodiments invert one of the subcells and electrically contacting the middle of the tandem with metal contacts. By introducing a third contact in accordance with a number of embodiments, the voltage and/or current across each subcell can be independently controlled, and therefore the subcells may not need to be current-matched. In many embodiments, the GaInP subcell of the three-terminal tandem solar cells can incorporate a thick GaInP cell to fully utilize the high open-circuit voltage advantages of GaInP solar cells.

Systems of tandem solar cells with three-terminal electrical contacts with subcells in accordance with various embodiments of the invention are discussed further below.

Three-Terminal Tandem Solar Cells

Many embodiments provide tandem solar cells with three-terminal metal contacts. In several embodiments, the three-terminal tandem solar cells implement thin films as the substrate. Thin film substrate for three-terminal tandem solar cells in accordance with certain embodiments can be materials that have matching lattice with GaAs. Examples of thin film substrate include (but not limited to) GaAs, germanium (Ge), and GaAs on sodium chloride (NaCl). As can readily be appreciated, any of a variety of thin film substrates can be utilized as appropriate to the requirements of specific applications in accordance with various embodiments of the invention. Some embodiments provide that the three-terminal tandem solar cells eliminate wafers such as GaAs wafers as the substrate. Three-terminal tandem solar cells using thin films as the substrate in accordance with many embodiments provide advantages including (but not limited to) lighter weight, high efficiency, and lower cost. Eliminating the wafer substrate can make the three-terminal tandem solar cells lighter in weight, which can be advantages for aerospace applications and/or space solar cell applications. In addition, thin film based three-terminal tandem solar cells can implement photon recycling processes in the III-V semiconductor solar cells, hence provide higher efficiency in electricity conversion. Furthermore, wafer substrates can be costly. It can reduce fabrication costs by recycling the wafer substrates during three-terminal tandem solar cell fabrication processes. In certain embodiments, the three-terminal tandem solar cells with thin film substrates can have electrodes deposited on both sides of the tandem cells. Tandem cells with a wafer substrate may not have electrodes on the back side of the solar cells.

In many embodiments, the three-terminal tandem solar cells implement at least one top cell and at least one bottom cell configuration. The top and the bottom cells can be III-V semiconductor solar cells. The top and bottom cells absorb light of different wavelengths with different efficiency. In some embodiments, the at least one top cell can be GaInP solar cell. GaInP top cells absorb mostly blue light and better at turning blue light into electricity. In certain embodiments, the at least one bottom cell can be GaAs solar cell. GaAs bottom cell absorbs both blue and red light, and is able to turn both blue and red light into electricity. As can readily be appreciated, any of a variety of top cell and bottom cell of the tandem solar cells can be utilized as appropriate to the requirements of specific applications in accordance with various embodiments of the invention.

Many embodiments implement window layers and/or back-surface-field (bsf) layers for top cells and bottom cells of the three-terminal tandem solar cells. The window layers and/or bsf layers can include (but are not limited to) undoped semiconductors, n-type doped semiconductors, and p-type doped semiconductors. Examples of n-type dopants for the semiconductor layers of the three-terminal tandem solar cells include (but are not limited to) S, Se, Te, and Si. Examples of p-type dopants for the semiconductor layers of the three-terminal tandem solar cells include (but are not limited to) Zn and Mg. In certain embodiments, heavy p-type doping can be achieved with carbon (C). As can readily be appreciated, any of a variety of dopant can be utilized as appropriate to the requirements of specific applications in accordance with various embodiments of the invention. In the three-terminal tandem solar cells, different window and/or bsf layers in the top and bottom cells respectively can be implemented in accordance with certain embodiments. Several embodiments provide that semiconductor layers including (but not limited to) undoped AlInP, p-type doped AlInP, and n-type doped AlInP, can be used as window and/or bsf layers for GaInP top cells. Some embodiments provide that semiconductor layers including (but not limited to) undoped GaInP, p-type doped GaInP, n-type doped GaInP, undoped AlGaAs, p-type doped AlGaAs, and n-type doped AlGaAs, can be used as window and/or bsf layers for GaAs bottom cells. In a number of embodiments, AlInP window and/or bsf layers are implemented for GaInP top cells and GaInP window and/or bsf layers are implemented for GaAs bottom cells. In certain embodiments, AlInP window and/or bsf layers are implemented for GaInP top cells and AlGaAs window and/or bsf layers are implemented for GaAs bottom cells. As can readily be appreciated, any of a variety of window and/or bsf layers can be utilized as appropriate to the requirements of specific applications in accordance with various embodiments of the invention.

In several embodiments, the GaInP top cells implement a highly n-type doped AlInP layer with an undoped AlInP layer as the window and/or bsf layer on a first side of the top cell. Some embodiments provide that the undoped AlInP layers have a thickness of about 5 nm and less than about 5 nm. The undoped AlInP layer can be in between the highly doped n-type AlInP layer and the GaInP top cell. The highly n-type doped AlInP layer can have a doping concentration of about 1E18, and a thickness of about 30 nm. Such window and/or bsf layer designs in accordance with embodiments can achieve low surface recombination velocities.

In some embodiments, the GaInP top cells implement a highly p-type doped AlInP layer with an undoped AlInP layer as the window and/or bsf layer on a second side of the top cell, where the second side is on the opposite side of the first side of the top cell. Some embodiments provide that the undoped AlInP layers have a thickness of about 5 nm and less than about 5 nm. The undoped AlInP layer can be in between the highly doped p-type AlInP layer and the GaInP top cell. The highly p-type doped AlInP layer can have a doping concentration of about 1E18, and a thickness of about 250 nm. In many embodiments, the GaInP top cell can have an undoped GaInP layer, a layer of p-type doped GaInP between the undoped GaInP layer and the undoped AlInP window and/or bsf layer, and a layer of n-type doped GaInP between the undoped GaInP layer and the undoped AlInP window and/or bsf layer. In many embodiments, the GaInP top cell can have a thickness of at least 2.75 microns to fully take advantage of its high open-circuit voltage. Some embodiments provide that the undoped GaInP layer of the top cell can have a thickness of about 2.75 microns. In certain embodiments, the p-type doped GaInP layer of the top cell can have a doping concentration of about 1E18, and a thickness of about 75 nm. In some embodiments, the n-type doped GaInP layer of the top cell can have a doping concentration of about 1E18, and a thickness of about 75 nm. As can readily be appreciated, any of a variety of tandem top cell structures, geometries, and compositions can be utilized as appropriate to the requirements of specific applications in accordance with various embodiments of the invention.

In some embodiments, the GaAs bottom cells implement a highly p-type doped GaInP layer with an undoped GaInP layer as the window and/or bsf layer on a first side of the bottom cell. Some embodiments provide that the undoped GaInP layers have a thickness of about 5 nm and less than about 5 nm. The undoped GaInP layer can be in between the highly doped p-type GaInP layer and the GaAs bottom cell. The highly p-type doped GaInP layer can have a doping concentration of about 1E18, and a thickness of about 20 nm. Such window and/or bsf layer design in accordance with embodiments can achieve low surface recombination velocities. In several embodiments, the GaAs bottom cells implement a highly n-type doped GaInP layer with an undoped GaInP layer as the window and/or bsf layer on a second side of the bottom cell, where the second side is on the opposite side of the first side of the bottom cell. Certain embodiments provide that the undoped GaInP layers have a thickness of about 5 nm and less than about 5 nm. The undoped GaInP layer can be in between the highly doped n-type GaInP layer and the GaAs bottom cell. The highly n-type doped GaInP layer can have a doping concentration of about 1E18, and a thickness of about 20 nm. In many embodiments, the GaAs bottom cell can have an undoped GaAs layer, a layer of p-type doped GaAs between the undoped GaAs layer and the undoped GaInP window and/or bsf layer, and a layer of n-type doped GaAs between the undoped GaAs layer and the undoped GaInP window and/or bsf layer. Some embodiments provide that the undoped GaAs layer of the bottom cell can have a thickness of about 1.75 microns. In certain embodiments, the p-type doped GaInP layer of the bottom cell can have a doping concentration of about 1E18, and a thickness of about 75 nm. In some embodiments, the n-type doped GaAs layer of the bottom cell can have a doping concentration of about 1E18, and a thickness of about 75 nm. As can readily be appreciated, any of a variety of tandem bottom cell structures, geometries, and compositions can be utilized as appropriate to the requirements of specific applications in accordance with various embodiments of the invention.

Many embodiments provide that the different window and/or bsf layer designs in the three-terminal tandem solar cells can facilitate the deposition of metal electrodes on both sides of the tandem cells. Different window and/or bsf layers can control the etching process and hence facilitate the metal electrodes deposition. In addition, the thin film substrate of the three-terminal tandem solar cells in accordance with several embodiments enable metal electrode deposition on both sides of the tandem cells.

In many embodiments, at least one transparent conductor layer can be placed between the top cell and the bottom cell of the three-terminal tandem solar cells. The transparent conductor layers in accordance with some embodiments can transport the hole charge carriers to the middle contacts with minimal conduction loss. In several embodiments, the transport conductor layer can be a heavily doped semiconductor layer. Examples of the transparent semiconductor layer include (but are not limited to) $Al_xGa_{1-x}As$, with x is about 0.4. In certain embodiments, the $Al_xGa_{1-x}As$ transparent conductor layer can be heavily doped with n-type dopant or p-type dopant. In a number of embodiments, the $Al_xGa_{1-x}As$ transparent conductor layer has a doping concentration of about 1E20 with p-type dopants, and a thickness of about 300 nm. Examples of n-type dopants for the semiconductor layers of the three-terminal tandem solar cells include (but are not limited to) S, Se, Te, and Si. Examples of p-type dopants for the semiconductor layers of the three-terminal tandem solar cells include (but are not limited to) Zn and Mg. In certain embodiments, heavy p-type doping can be achieved with carbon (C). As can readily be appreciated, any of a variety of transparent conductor layer compositions and thickness can be utilized as appropriate to the requirements of specific applications in accordance with various embodiments of the invention.

In several embodiments, the three-terminal tandem solar cells have three electrodes: the top electrodes, the middle electrodes, and the bottom electrodes. The three-terminal tandem solar cells enable electrical contact with each subcell. By adding the middle electrodes, the three-terminal tandem could eliminate the current matching constraint between the subcells and the parasitic tunnel junction. The three-terminal design enable independently control the current and/or voltage of each subcell, and hence the subcells do not need to be current-matched. Because of the elimination of current matching between the subcells, the top cell of the three-tandem solar cells can have a thickness of at least 2.75 microns to take advantage of its high open-circuit potential. In some embodiments, at least one bottom electrode is deposited on a second side of the bottom cell. In certain embodiments, the first side of the bottom cell, which is on the opposite side of the bottom side, is in closer contact with the top cell. Many embodiments provide that at least one top electrode is deposited on a first side of the top cell, where the second side of the top cell is in closer contact with the bottom cell. In a number of embodiments, at least one middle electrode is deposited on the transparent conductor layer. Examples of bottom electrodes on the bottom GaAs cell side include (but are not limited to) AuGeNi, CuGe, and PdGe. Examples of top electrodes on the top GaInP cell side include (but are not limited to) AuPdGe. Examples of middle electrodes on the transparent conductor layer include (but are not limited to) Au, Ag, AuZn, and Ti/Pt/Au. Ti/Pt/Au metallization system can form Ohmic contacts with the conductor layers. In some embodiments, the electrodes can have a width ranging from about 10 microns to about 20 microns. As can readily be appreciated, any of a variety of electrode geometries and compositions can be utilized as appropriate to the requirements of specific applications in accordance with various embodiments of the invention.

In a number of embodiments, at least one middle electrode is deposited on a first side of the bottom cell and at least one bottom electrode is deposited on a second side of the bottom cell, where the first side of the bottom cell is in closer contact with the top cell. Several embodiments provide that at least one top electrode is deposited on a first side of the top cell. In certain embodiments, the second side of the top cell, which is on the opposite side of the first side, is in closer contact with the bottom cell.

In many embodiments, at least one contact layer including (but not limited to) GaAs layer, n-type doped GaAs layer, can be deposited on the top and the bottom of the three-terminal tandem solar cell. The number of defects at the interface may affect the contact quality and GaAs contact layer can form better Ohmic contact with the semiconductor layers. In some embodiments, GaAs contact layer can have a doping concentration of about 5E18, and a thickness of about 50 nm. As can readily be appreciated, any of a variety of contact layer can be utilized as appropriate to the requirements of specific applications in accordance with various embodiments of the invention. In some embodiments, mechanical handle layers can be deposited on the bottom side of the tandem cells to provide mechanical support to the thin-film based tandem solar cells. Examples of mechanical handle layers include (but are not limited to) solution-processable polyimides and silicones. As can readily be appreciated, any of a variety of mechanical handle support layers can be utilized as appropriate to the requirements of specific applications in accordance with various embodiments of the invention. In several embodiments, anti-reflection coating layers can be deposited on the top side of the tandem solar cells. Examples of anti-reflective coatings include (but are not limited to) $TiO_2$, $Si_3N_4$, $SiO_2$, and combinations thereof. As can readily be appreciated, any of a variety of anti-reflection layers can be utilized as appropriate to the requirements of specific applications in accordance with various embodiments of the invention.

FIG. 1 illustrates the structure of a three-terminal tandem solar cell in accordance with an embodiment of the invention. Many embodiments implement III-V semiconductor solar cells as top cell and bottom cell. The three-terminal tandem solar cell (100) include GaInP top cell (107) and GaAs bottom cell (103). The GaInP top cell (107) can include at least one undoped GaInP layer, at least one n-type doped GaInP layer, and at least one p-type doped GaInP layer. The GaInP top cell (107) can have a thickness of at least 2.75 microns to take advantage of its high open-circuit potential. In some embodiments, the undoped GaInP layer can have a thickness of about 2.75 microns, the n-type doped GaInP layer can have a thickness of about 75 nm and a doping concentration of about 1E18, and the p-type doped GaInP layer can have a thickness of about 75 nm and a doping concentration of about 1E18. Examples of n-type dopants include (but are not limited to) S, Se, Te, and Si. Examples of p-type dopants include (but are not limited to) Zn and Mg, and heavy p-type doping can be achieved with C. The top GaInP cell (107) can have at least one window and/or bsf layer (106) on the first side and the second side of the top GaInP cell (107). The window and/or bsf layer (106) of the top GaInP cell can include at least one undoped AlInP layer, and at least one p-type doped or n-type doped AlInP layer. At least one layer of undoped AlInP layer and at least one layer of n-type doped AlInP layer (106) can be deposited on the first side of the GaInP top cell (107). The undoped AlInP layer can be 5 nm thick, and the n-type doped AlInP can be 30 nm thick and has a doping density of about 1E18. At least one layer of undoped AlInP layer and at least one layer of p-type doped AlInP layer (106) can be deposited on the second side of the GaInP top cell (107). The undoped AlInP layer can be 5 nm thick, and the p-type doped AlInP can be 250 nm thick and has a doping density of about 1E18.

In many embodiments, a central, heavily doped transparent conductor layer (105) can be deposited between the top cell (107) and the bottom cell (103). The GaInP top cell (107) absorbs the light above the bandgap of this material. The central conductor layer (105) can be heavily doped and has a thickness of at least 300 nm. The central conductor layer (105) can transport the holes in the tandem cells to the middle metal contacts (104) with minimal conduction loss. The transparent conductor layer (105) can be $Al_xGa_{1-x}As$ layer with x approximately 0.4. The transparent conductor $Al_xGa_{1-x}As$ layer can be heavily p-type doped with a doping concentration of about 1E20, and a thickness of about 300 nm.

The GaAs bottom cell (103) can include at least one undoped GaAs layer, at least one n-type doped GaAs layer, and at least one p-type doped GaAs layer. The GaAs bottom cell (103) can have a thickness of at least 1.75 microns to take advantage of its high open-circuit potential. In some embodiments, the undoped GaAs layer can have a thickness of about 1.75 microns, the n-type doped GaAs layer can have a thickness of about 75 nm and a doping concentration of about 1E18, and the p-type doped GaAs layer can have a thickness of about 75 nm and a doping concentration of about 1E18. Examples of n-type dopants include (but are not limited to) S, Se, Te, and Si. Examples of p-type dopants include (but are not limited to) Zn and Mg, and heavy p-type doping can be achieved with C. The bottom GaAs cell (103) can have at least one window and/or bsf layer (102) on the first side and the second side of the top GaAs cell (103). The window and/or bsf layer (102) of the bottom GaAs cell can include at least one undoped semiconductor window layer, and at least one p-type doped or n-type doped semiconductor window layer. Examples of the semiconductor window layer of the bottom GaAs cell include (but not limited to) AlGaAs or GaInP. In some embodiments, at least one layer of undoped GaInP layer and at least one layer of p-type doped GaInP layer (102) can be deposited on the first side of the GaAs bottom cell (103). The undoped GaInP layer can be 5 nm thick, and the p-type doped GaInP can be 20 nm thick and has a doping density of about 1E18. At least one layer of undoped GaInP layer and at least one layer of n-type doped GaInP layer (102) can be deposited on the second side of the GaAs bottom cell (103). The undoped GaInP layer can be 5 nm thick, and the n-type doped GaInP can be 20 nm thick and has a doping density of about 1E18.

Many embodiments implement electrical electrodes to establish three-terminal contacts with the tandem solar cells. The different window and/or bsf layers allow the deposition of electrical electrodes in contact with each subcell. Top electrodes (108) can be deposited on the top of the window layer (106) on the first side of the GaInP top cell (107). The top electrodes (108) form Ohmic contact with the window layer. Examples of the top electrodes include (but not limited to) AuPdGe contacts. Middle electrodes (104) can be deposited on the transparent conductor layer (105) to form Ohmic contact with the transparent conductor layer (105). Examples of the middle electrodes include (but are not limited to) Au, Ag, AuZn, and Ti/Pt/Au. Bottom electrodes (101) can be deposited on the window layer (102) on the second side of the GaAs bottom cell (103). The bottom electrodes (101) form Ohmic contact with the window layer. Examples of the bottom electrodes include (but are not limited to) AuGeNi contacts, CuGe contacts, and PdGe contacts. In many embodiments, each of the top electrodes (108) and each of the middle electrodes (104) are aligned along the vertical center to prevent shadow loss. The distance (d) between the outer edge of the middle electrodes (104) and the outer edge of the window layer should be kept to prevent contact between the electrodes and the GaAs cell. If the electrodes are in contact with GaAs bottom cell, it may create a short. The distance (d) should be kept as narrow as possible to minimize lost photocurrent due to etching the GaAs.

Figure 2:
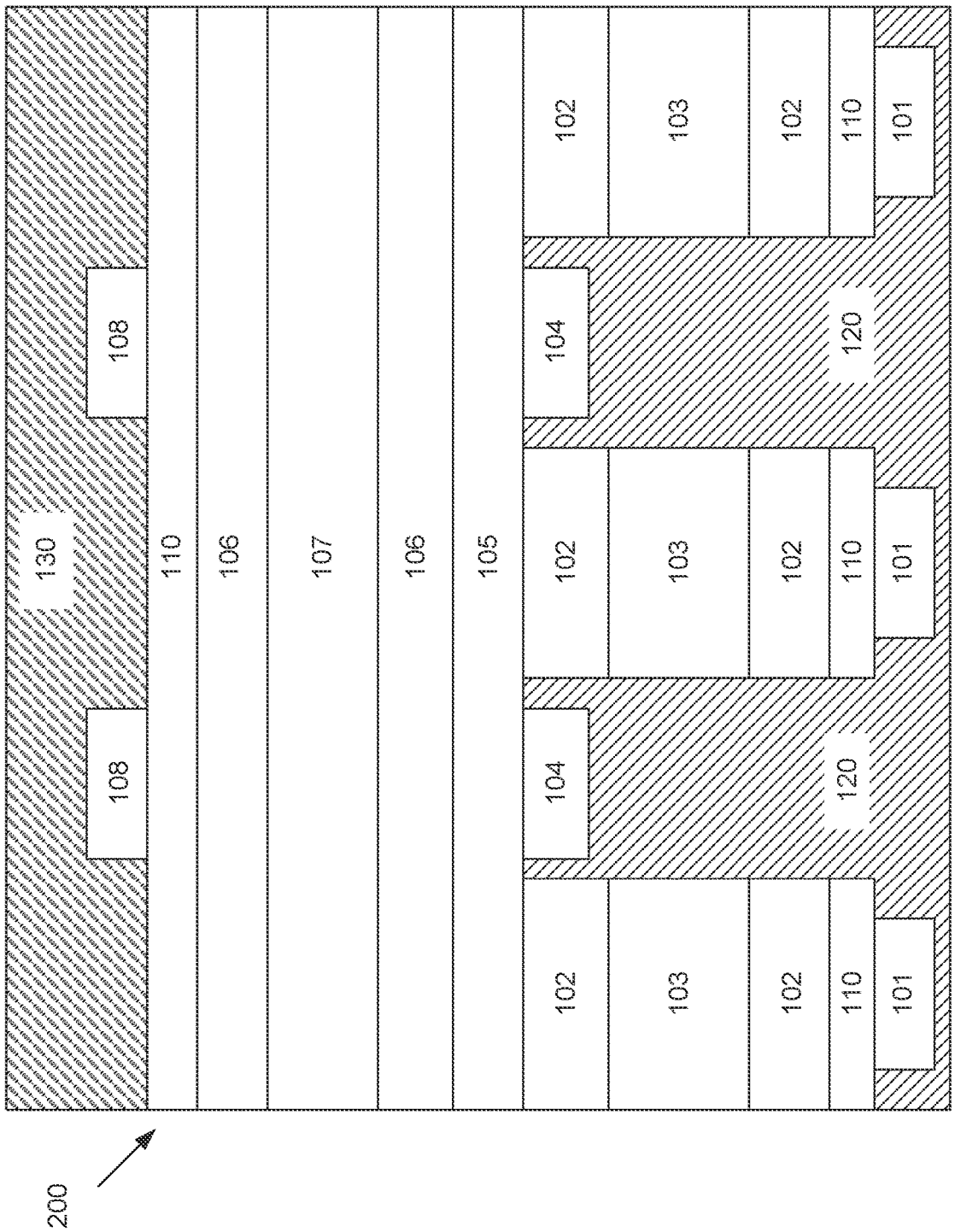
FIG. 2 illustrates a three-terminal tandem solar cell with additional layers in accordance with an embodiment of the invention.

FIG. 2 illustrates a three-terminal tandem solar cell with anti-reflective coating layers and contact layers in accordance with an embodiment of the invention. The three-terminal tandem solar cell (200) include GaInP top cell (107) and GaAs bottom cell (103). The GaInP top cell (107) can include at least one undoped GaInP layer, at least one n-type doped GaInP layer, and at least one p-type doped GaInP layer. The top GaInP cell (107) can have at least one window and/or bsf layer (106) on the first side and the second side of the top GaInP cell (107). The window and/or bsf layer (106) of the top GaInP cell can include at least one undoped AlInP layer, and at least one p-type doped or n-type doped AlInP layer. At least one layer of undoped AlInP layer and at least one layer of n-type doped AlInP layer (106) can be deposited on the first side of the GaInP top cell (107). At least one layer of undoped AlInP layer and at least one layer of p-type doped AlInP layer (106) can be deposited on the second side of the GaInP top cell (107). At least one semiconductor contact layer (110) can be deposited between the window layer (106) and the top electrodes (108) to establish low resistance Ohmic contacts with the electrodes. Examples of the contact layer include (but are not limited to) GaAs. The contact layer (110) can be a n-type doped GaAs layer with a doping concentration of about 5E18 and a thickness of about 50 nm. The GaAs contact layer can establish a better contact layer as contacting the wide bandgap materials may be challenging.

In many embodiments, a central, heavily doped transparent conductor layer (105) can be deposited between the top cell (107) and the bottom cell (103). The central conductor layer (105) can transport the holes in the tandem cells to the middle metal contacts (104) with minimal conduction loss. The GaAs bottom cell (103) can include at least one undoped GaAs layer, at least one n-type doped GaAs layer, and at least one p-type doped GaAs layer. The bottom GaAs cell (103) can have at least one window and/or bsf layer (102) on the first side and the second side of the top GaAs cell (103). The window and/or bsf layer (102) of the bottom GaAs cell can include at least one undoped semiconductor window layer, and at least one p-type doped or n-type doped semiconductor window layer. Examples of the semiconductor window layer of the bottom GaAs cell include (but not limited to) AlGaAs or GaInP. In some embodiments, at least one layer of undoped GaInP layer and at least one layer of p-type doped GaInP layer (102) can be deposited on the first side of the GaAs bottom cell (103). At least one layer of undoped GaInP layer and at least one layer of n-type doped GaInP layer (102) can be deposited on the second side of the GaAs bottom cell (103). At least one semiconductor contact layer (110) can be deposited between the window layer (102) and the bottom electrodes (101) to establish low resistance Ohmic contacts with the electrodes. Examples of the contact layer include (but are not limited to) GaAs. The contact layer (110) can be a n-type doped GaAs layer with a doping concentration of about 5E18 and a thickness of about 50 nm.

Many embodiments implement anti-reflection coating layers for the three-terminal tandem solar cells. At least one top anti-reflective coating layer (130) can cover the top of the tandem cell including top electrodes (108) and the contact layer (110). Examples of the anti-reflection layers can include (but are not limited to) $TiO_2$, $Si_3N_4$, $SiO_2$, and any combinations thereof.

In many embodiments, mechanical handle layers may be deposited to support the thin film tandem solar cell. Some embodiments provide that at least one mechanical handle layer (120) can cover the bottom of the tandem cell including the bottom electrodes (101), the middle electrodes (104) and the contact layer (110). Examples of the mechanical handle layers include (but are not limited to) solution processable polyimide and silicone. Certain embodiments implement Nexolve CP1 as the mechanical handle layer. A number of embodiments implement Sylgard 184 as the mechanical handle layer.

Figure 3:
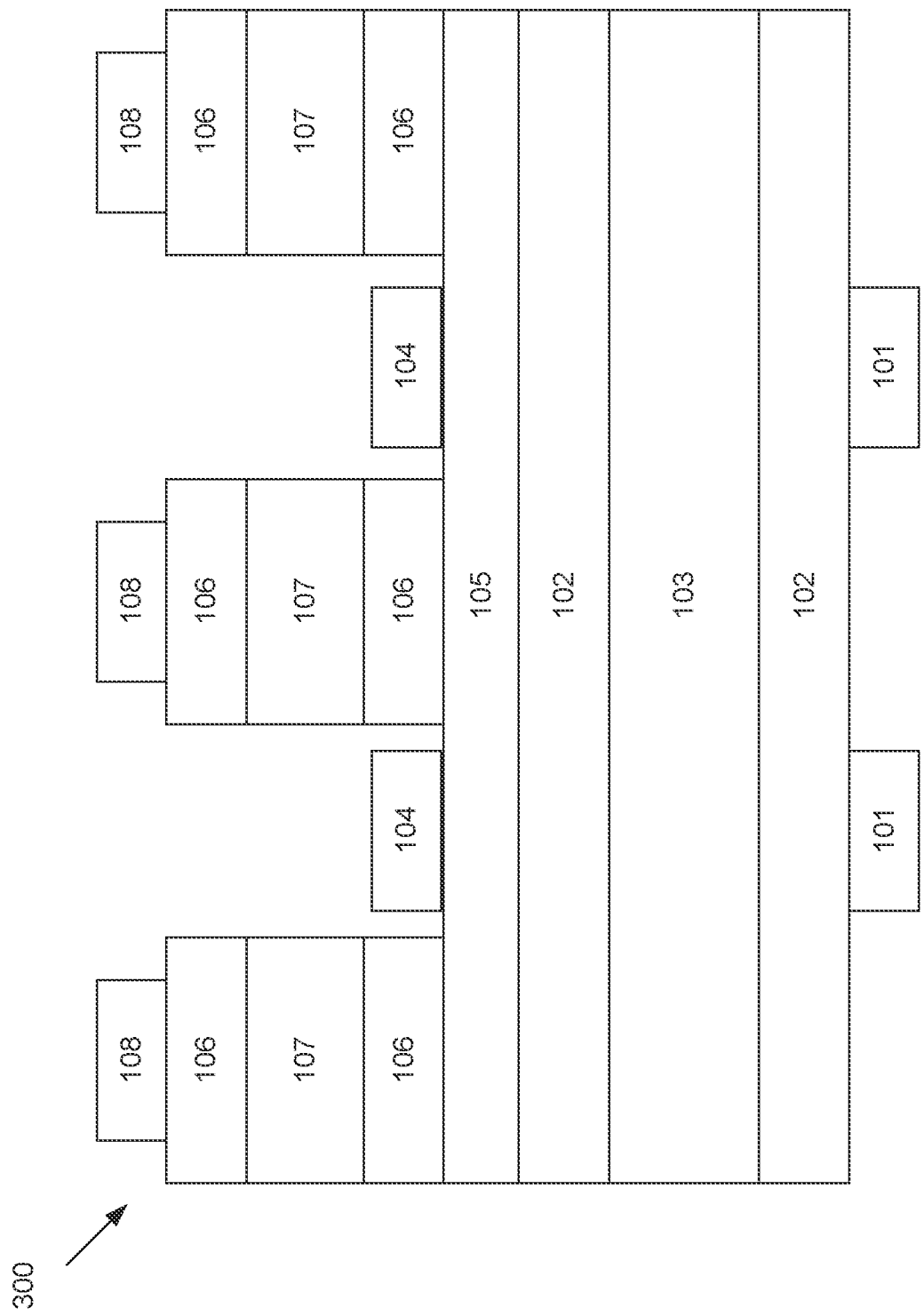
FIG. 3 illustrates an alternative three-terminal tandem solar cell structure in accordance with an embodiment of the invention.

FIG. 3 illustrates the structure of a three-terminal tandem solar cell in accordance with an embodiment of the invention. Many embodiments implement III-V semiconductor solar cells as top cell and bottom cell. The three-terminal tandem solar cell (300) include GaInP top cell (107) and GaAs bottom cell (103). The GaInP top cell (107) can include at least one undoped GaInP layer, at least one n-type doped GaInP layer, and at least one p-type doped GaInP layer. The GaInP top cell (107) can have a thickness of at least 2.75 microns to take advantage of its high open-circuit potential. In some embodiments, the undoped GaInP layer can have a thickness of about 2.75 microns, the n-type doped GaInP layer can have a thickness of about 75 nm and a doping concentration of about 1E18, and the p-type doped GaInP layer can have a thickness of about 75 nm and a doping concentration of about 1E18. Examples of n-type dopants include (but are not limited to) S, Se, Te, and Si. Examples of p-type dopants include (but are not limited to) Zn and Mg, and heavy p-type doping can be achieved with C. The top GaInP cell (107) can have at least one window and/or bsf layer (106) on the first side and on the second side of the top GaInP cell (107). The window and/or bsf layer (106) of the top GaInP cell can include at least one undoped AlInP layer, and at least one p-type doped or n-type doped AlInP layer. At least one layer of undoped AlInP layer and at least one layer of n-type doped AlInP layer (106) can be deposited on the first side of the GaInP top cell (107). The undoped AlInP layer can be 5 nm thick, and the n-type doped AlInP can be 30 nm thick and has a doping density of about 1E18. At least one layer of undoped AlInP layer and at least one layer of p-type doped AlInP layer (106) can be deposited on the second side of the GaInP top cell (107). The undoped AlInP layer can be 5 nm thick, and the p-type doped AlInP can be 250 nm thick and has a doping density of about 1E18.

In many embodiments, a central, heavily doped transparent conductor layer (105) can be deposited between the top cell (107) and the bottom cell (103). The GaInP top cell (107) absorbs the light above the bandgap of this material. The central conductor layer (105) can be heavily doped and has a thickness of at least 300 nm. The central conductor layer (105) can transport the holes in the tandem cells to the middle metal contacts (104) with minimal conduction loss. The transparent conductor layer (105) can be $Al_xGa_{1-x}As$ layer with x approximately 0.4. The transparent conductor $Al_xGa_{1-x}As$ layer can be heavily p-type doped with a doping concentration of about 1E20, and a thickness of about 300 nm.

The GaAs bottom cell (103) can include at least one undoped GaAs layer, at least one n-type doped GaAs layer, and at least one p-type doped GaAs layer. The GaAs bottom cell (103) can have a thickness of at least 1.75 microns to take advantage of its high open-circuit potential. In some embodiments, the undoped GaAs layer can have a thickness of about 1.75 microns, the n-type doped GaAs layer can have a thickness of about 75 nm and a doping concentration of about 1E18, and the p-type doped GaAs layer can have a thickness of about 75 nm and a doping concentration of about 1E18. Examples of n-type dopants include (but are not limited to) S, Se, Te, and Si. Examples of p-type dopants include (but are not limited to) Zn and Mg, and heavy p-type doping can be achieved with C. The bottom GaAs cell (103) can have at least one window and/or bsf layer (102) on the first side and on the second side of the top GaAs cell (103). The window and/or bsf layer (102) of the bottom GaAs cell can include at least one undoped semiconductor window layer, and at least one p-type doped or n-type doped semiconductor window layer. Examples of the semiconductor window layer of the bottom GaAs cell include (but are not limited to) AlGaAs or GaInP. In some embodiments, at least one layer of undoped GaInP layer and at least one layer of p-type doped GaInP layer (102) can be deposited on the first side of the GaAs bottom cell (103). The undoped GaInP layer can be 5 nm thick, and the p-type doped GaInP can be 20 nm thick and has a doping density of about 1E18. At least one layer of undoped GaInP layer and at least one layer of n-type doped GaInP layer (102) can be deposited on the second side of the GaAs bottom cell (103). The undoped GaInP layer can be 5 nm thick, and the n-type doped GaInP can be 20 nm thick and has a doping density of about 1E18.

Many embodiments implement electrical electrodes to establish three-terminal contacts with the tandem solar cells. The different window and/or bsf layers allow the deposition of electrical electrodes in contact with each subcell. Top electrodes (108) can be deposited on the top of the window layer (106) on the first side of the GaInP top cell (107). The top electrodes (108) form Ohmic contact with the window layer. Examples of the top electrodes include (but are not limited to) AuPdGe contacts. Middle electrodes (104) can be deposited on the transparent conductor layer (105) and form Ohmic contact with the transparent conductor layer. Examples of the middle electrodes include (but not limited to) Au, Ag, AuZn, and Ti/Pt/Au. Bottom electrodes (101) can be deposited on the window layer (102) on the second side of the GaAs bottom cell (103). The bottom electrodes (101) form Ohmic contact with the window layer. Examples of the bottom electrodes include (but are not limited to) AuGeNi contacts, CuGe contacts, and PdGe contacts. In many embodiments, each of the bottom electrodes (101) and each of the middle electrodes (104) are aligned along the vertical center to prevent shadow loss.

Figure 4:
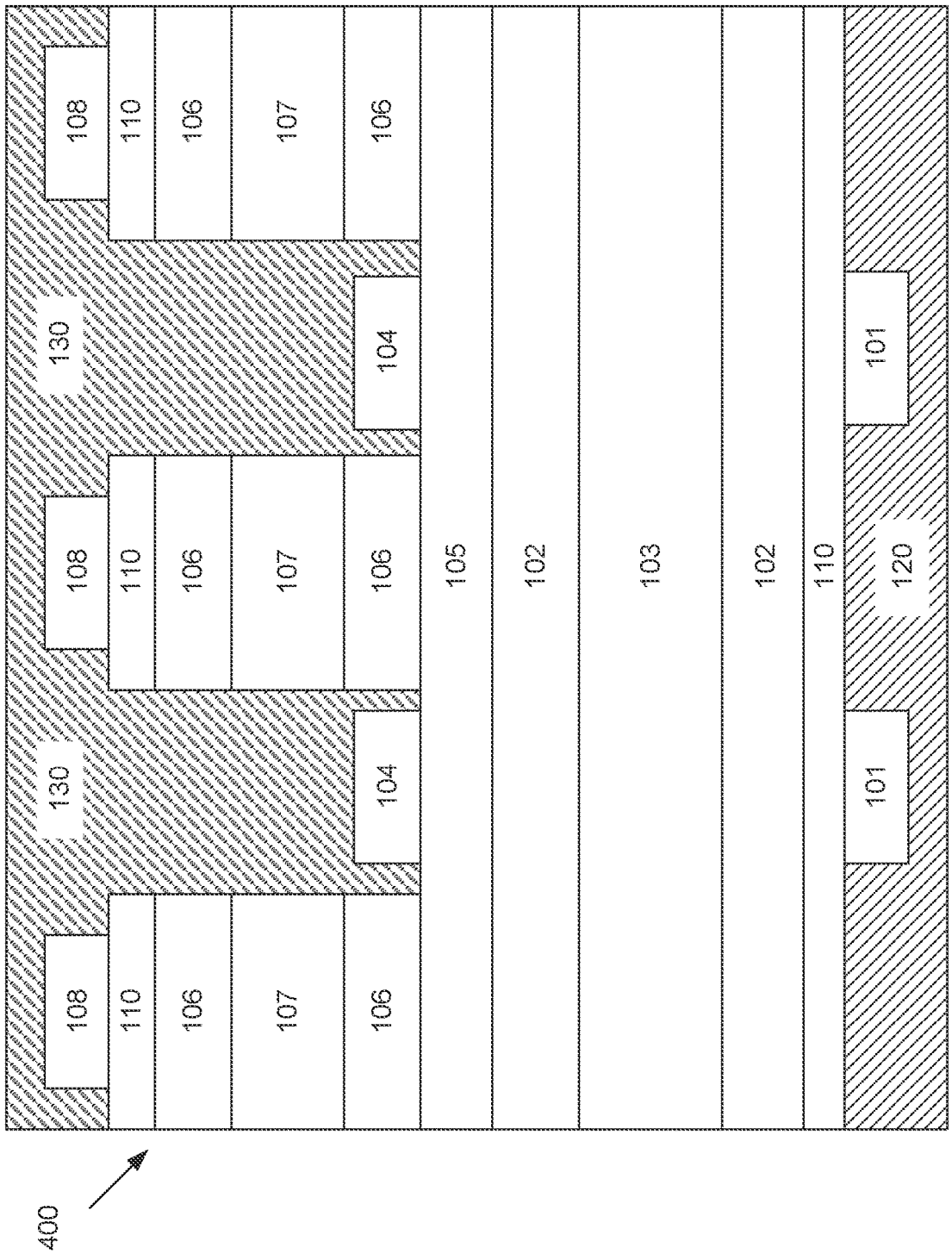
FIG. 4 illustrates a three-terminal tandem solar cell with additional layers in accordance with an embodiment of the invention.

FIG. 4 illustrates a three-terminal tandem solar cell with anti-reflective coating layers and contact layers in accordance with an embodiment of the invention. The three-terminal tandem solar cell (400) includes GaInP top cell (107) and GaAs bottom cell (103). The GaInP top cell (107) can include at least one undoped GaInP layer, at least one n-type doped GaInP layer, and at least one p-type doped GaInP layer. The top GaInP cell (107) can have at least one window and/or bsf layer (106) on the first side and the second side of the top GaInP cell (107). The window and/or bsf layer (106) of the top GaInP cell can include at least one undoped AlInP layer, and at least one p-type doped or n-type doped AlInP layer. At least one layer of undoped AlInP layer and at least one layer of n-type doped AlInP layer (106) can be deposited on the first side of the GaInP top cell (107). At least one layer of undoped AlInP layer and at least one layer of p-type doped AlInP layer (106) can be deposited on the second side of the top GaInP cell (107). At least one semiconductor contact layer (110) can be deposited between the window layer (106) and the top electrodes (108) to establish low resistance Ohmic contacts with the electrodes. Examples of the contact layer include (but are not limited to) GaAs. The contact layer (110) can be a n-type doped GaAs layer with a doping concentration of about 5E18 and a thickness of about 50 nm. The GaAs contact layer can establish a better contact layer as contacting the wide bandgap materials may be challenging.

In many embodiments, a central, heavily doped transparent conductor layer (105) can be deposited between the top cell (107) and the bottom cell (103). The central conductor layer (105) can transport the holes in the tandem cells to the middle metal contacts (104) with minimal conduction loss. The GaAs bottom cell (103) can include at least one undoped GaAs layer, at least one n-type doped GaAs layer, and at least one p-type doped GaAs layer. The bottom GaAs cell (103) can have at least one window and/or bsf layer (102) on the first side and the second side of the top GaAs cell (103). The window and/or bsf layer (102) of the bottom GaAs cell can include at least one undoped semiconductor window layer, and at least one p-type doped or n-type doped semiconductor window layer. Examples of the semiconductor window layer of the bottom GaAs cell include (but are not limited to) AlGaAs or GaInP. In some embodiments, at least one layer of undoped GaInP layer and at least one layer of p-type doped GaInP layer (102) can be deposited on the first side of the GaAs bottom cell (103). At least one layer of undoped GaInP layer and at least one layer of n-type doped GaInP layer (102) can be deposited on the second side of the GaAs bottom cell (103). At least one semiconductor contact layer (110) can be deposited between the window layer (102) and the bottom electrodes (101) to establish low resistance Ohmic contacts with the electrodes. Examples of the contact layer include (but are not limited to) GaAs. The contact layer (110) can be a n-type doped GaAs layer with a doping concentration of about 5E18 and a thickness of about 50 nm.

Many embodiments implement anti-reflection coating layers for the three-terminal tandem solar cells. At least one top anti-reflective coating layer (130) can cover the top of the tandem cell including top electrodes (108), the middle electrodes (104), and the contact layer (110). Examples of the anti-reflection layers can include (but are not limited to) $TiO_2$, $Si_3N_4$, $SiO_2$, and any combinations thereof.

In several embodiment, mechanical handle layers may be deposited to support the thin film tandem solar cells. In some embodiments, at least one mechanical handle layer (120) can be deposited to cover the bottom of the tandem cell including the bottom electrodes (101) and the contact layer (110). Examples of the mechanical handle layers include (but are not limited to) solution processable polyimide and silicone. Certain embodiments implement Nexolve CP1 as the mechanical handle layer. A number of embodiments implement Sylgard 184 as the mechanical handle layer.

While various structures of three-terminal tandem solar cells are described above with references to FIG. 1-FIG. 4, any variety of three-terminal tandem solar cell structures, geometries, and compositions can be utilized as appropriate to the requirements of specific applications in accordance with various embodiments of the invention. Processes for fabricating three-terminal tandem solar cells in accordance with various embodiments of the invention are discussed further below.

Fabrication of Three Terminal Tandem Solar Cells

Many embodiments provide fabrication methods for three-terminal tandem solar cells. In several embodiments, the tandem cells can be grown upside down. In many embodiments, a stack of tandem solar cell materials including the top GaInP cells and corresponding window layers, the central transparent conductor layer, and the bottom GaAs cells and corresponding window layers, can be grown on a wafer substrate including (but are not limited to) GaAs wafer substrate. Examples of methods to epitaxially grow the stack of tandem solar cell materials on the GaAs substrate include (but are not limited to) metalorganic chemical vapor deposition, hydride vapor phase epitaxy, liquid phase epitaxy, and molecular beam epitaxy. In certain embodiments, a release layer can be deposited between the wafer substrate and the stack of tandem solar cell materials. The release layer in accordance with some embodiments can be etched away to release the wafer substrate. Examples of the release layer include (but are not limited to) $Al_xGa_{1-x}As$ layer. In some embodiments, x can be greater than 0.6 for the $Al_xGa_{1-x}As$ release layer. In certain embodiments, the $Al_xGa_{1-x}As$ release layer can have a thickness of at least 10 nm. In several embodiments, the $Al_xGa_{1-x}As$ release layer has a thickness of about 50 nm. Many embodiments provide that the $Al_xGa_{1-x}As$ release layer can be etched in HF to separate the tandem cell from the carrier wafer.

Figure 5B:
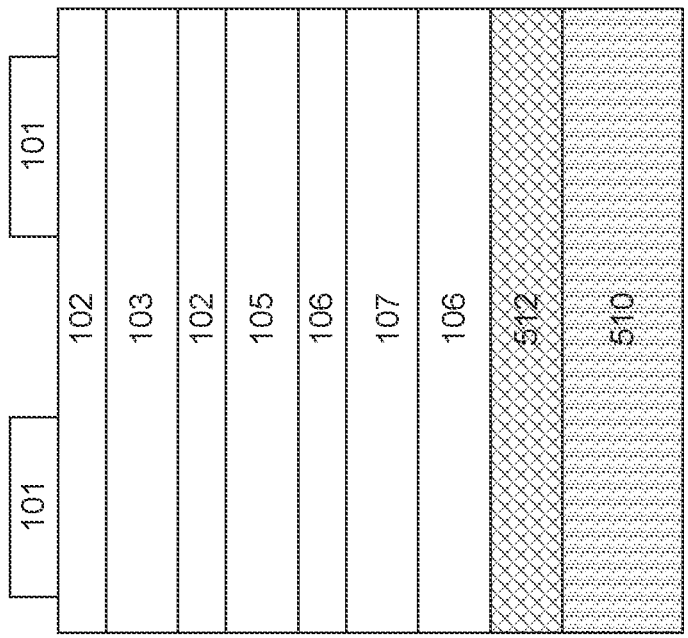
FIGS. 5A-5H illustrate a step by step fabrication process of manufacturing a three-terminal tandem solar cell in accordance with an embodiment of the invention.
Figure 5A:
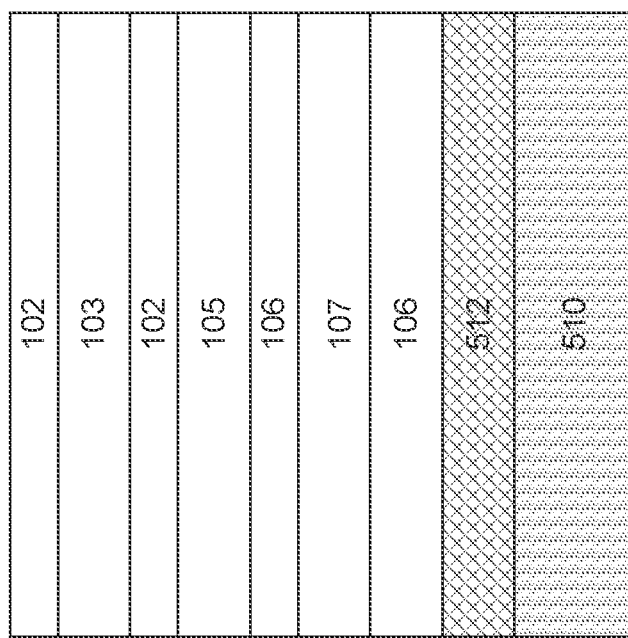

FIG. 5A-FIG. 5H illustrate a step by step fabrication process of manufacturing a three-terminal tandem solar cell in accordance with an embodiment of the invention. In FIG. 5A, a stack of tandem solar cell materials is grown on a GaAs wafer substrate (510) in an upside-down order. An AlGaAs release layer (512) is deposited in between the stack of tandem cell materials and the GaAs substrate (510). The stack of tandem cell materials includes the GaInP top cell (107) and the AlInP layers (106) as the corresponding window and/or bsf layers, the central transparent conductor AlGaAs layer (105), the GaAs bottom cell (103), the GaInP layers or the AlGaAs layers (102) as the corresponding widow and/or bsf layers.

FIG. 5B illustrates the formation of GaAs metallization. Bottom electrodes (101) can be deposited on the window layer of the GaAs bottom cell. The bottom electrodes (101) can be n-type contact pads. A GaAs contact layer (not shown) can be deposited between the bottom electrodes (101) and the window layer (102) to help form Ohmic contacts between the bottom cell and the bottom electrodes. Examples of metallurgies include (but are not limited to) AuGeNi, CuGe, and PdGe. The electrodes can be deposited using shadow mask and/or lithography techniques.

Figure 5D:
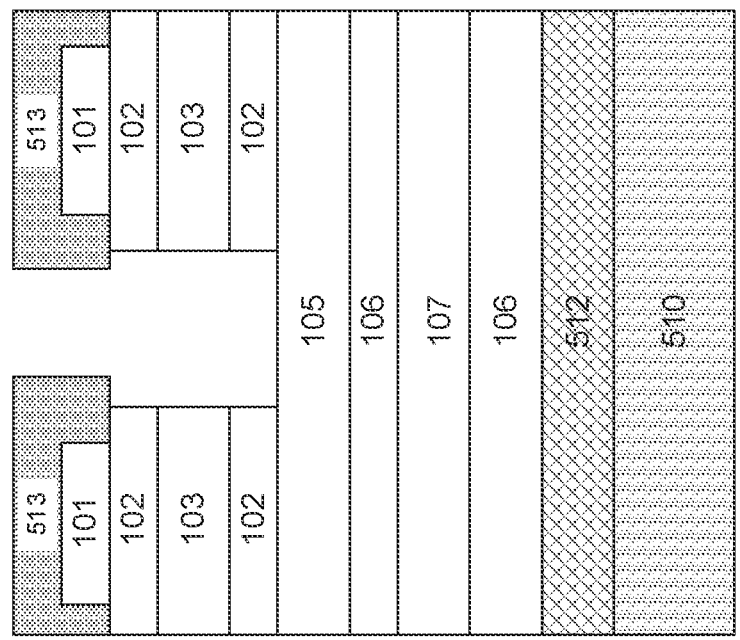
Figure 5C:
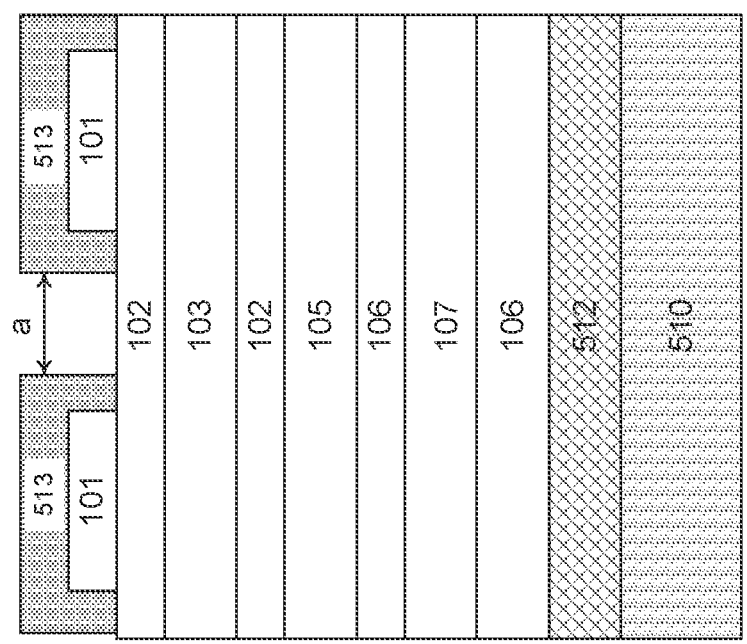

FIG. 5C illustrates lithographically defining the middle contact area. The stack of materials can be photolithographically patterned with slits. The region that will be etched for the middle electrodes layer can be defined using lithography. The photomask (513) can be deposited on the bottom electrodes and covers the three sides of the bottom electrodes (101). The photomask (513) can protect the bottom electrodes during the following etching step, and define the region for the middle electrodes. The GaAs bottom cell (103) and the corresponding window layers (102) that are not protected by the photomask may be etched away to form the region to deposit the middle electrodes. The slits of the photomask should have a distance (a) such that there will be a gap between the GaAs cell and the middle electrodes. In some embodiments, the distance a can be about at least 10 microns.

FIG. 5D illustrates an etch process to define the regions for middle electrodes. The photolithographically patterned stack can then be etched with an etchant to leave a trench undercutting the photoresist that can have metal contacts evaporate into, forming the middle electrodes. The different window layers of the GaInP top cell (107) and the GaAs bottom cell (103) can help control the etching process. In some embodiments, the stack can be etched down to the central transparent contact layer (105). The etching process can be controlled because the phosphides can be etched by undissociated HCl while arsenides may not, and arsenides can be etched by phosphoric acid based etches while phosphides may not. An example of arsenide etch can be a 3-part phosphoric acid, 1-part peroxide, and 50-part water solution mixture (mixed by volume) which etches arsenides at a rate of about 100 nm/min. Another example of arsenides etch can be a sulfuric acid-based etchant that is selective for arsenides over phosphides. An example of phosphide etch can be 1 molar HCl in acetic acid made by diluting aqueous HCl in acetic acid. The acetic acid may be important for reducing the etch rate to a reasonable rate, given that pure HCl may etch InP at a rate of greater than 3 microns/min.

Figure 5F:
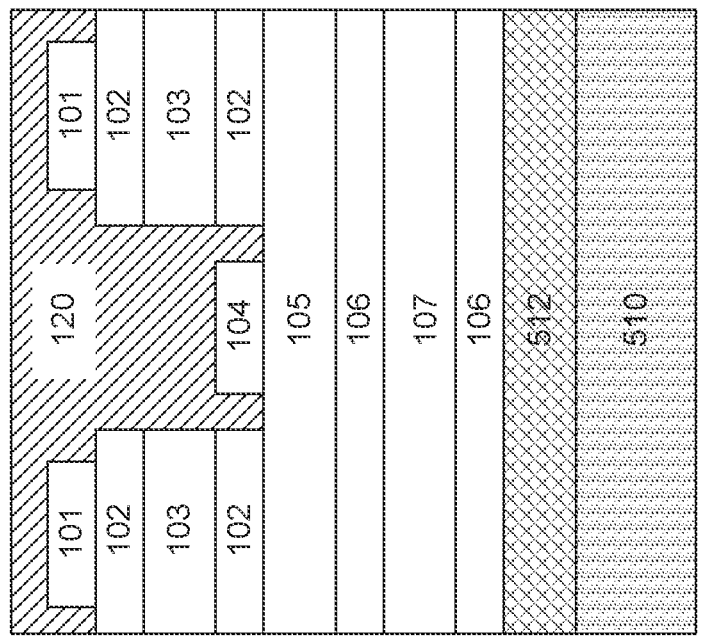
Figure 5E:
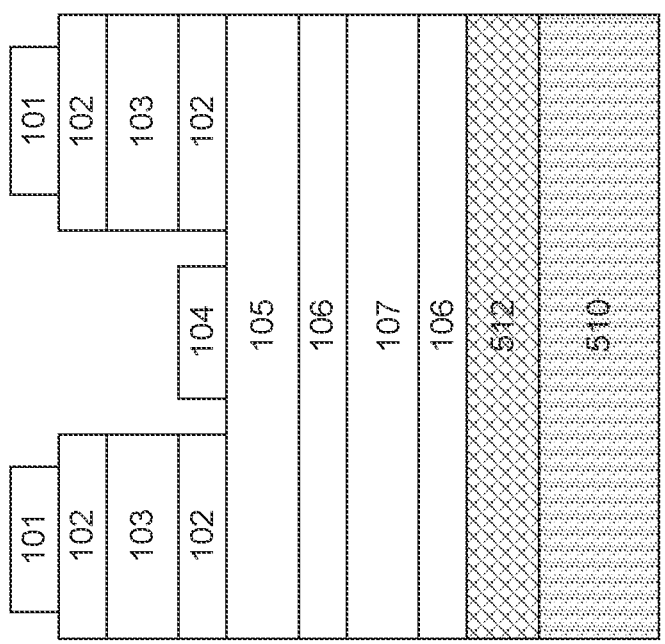

FIG. 5E illustrates the process of depositing the middle electrodes and lifting off the photomask. The middle electrodes (104) can be deposited and form Ohmic contacts to the transparent conductor layer (105). The transparent conductor layer can be a heavily-doped p-type AlGaAs layer, and it can form Ohmic contacts with metal contacts relatively easily. Examples of middle electrodes include (but are not limited to) gold, silver, AuZn and Ti/Pt/Au. The photoresist masks (513) can then be dissolved, removing the excess metal. Special attention may be needed to make sure metal does not get on the sidewalls of the etched trench which may shunt the cell. This can be avoided by performing the etches such that they undercut the resist.

FIG. 5F illustrates the process of applying a mechanical support handle layers to the thin film based three-terminal tandem solar cell. Mechanical support handle layer (120) can be deposited to help support the thin-film solar cell. The mechanical support handle layer (120) covers the bottom electrodes (101), the middle electrodes (104), and the bottom cell (103) and the corresponding widow layers (102). Examples of the mechanical handle layers include (but are not limited to) solution processable polyimide and silicone. Certain embodiments implement Nexolve CP1 as the mechanical handle layer. A number of embodiments implement Sylgard 184 as the mechanical handle layer.

Figure 5H:
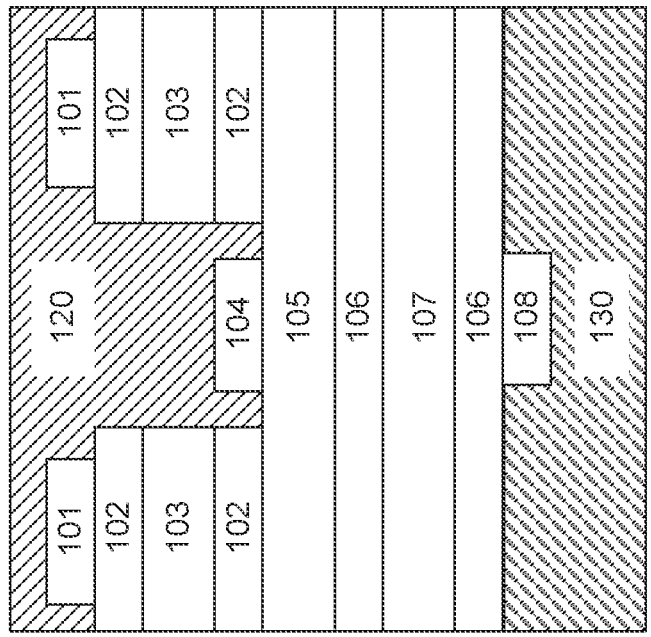
Figure 5G:
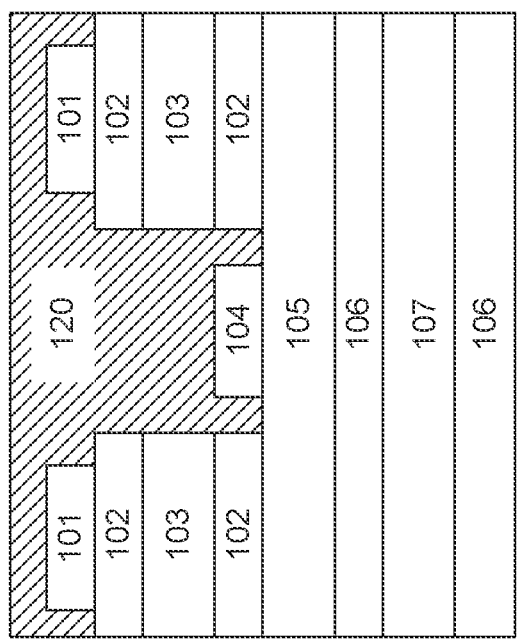

FIG. 5G illustrates the process of removing the wafer substrate. The tandem solar cell can be removed from the wafer substrate (510) it is grown on. This can be accomplished by etching the AlGaAs release layer (512). An example of the etchant can be HF. Many embodiments provide that the aluminum fraction (x) of the central transparent conductor $Al_xGa_{1-x}As$ layer has been chosen so that the central transparent conductor layer will not be rapidly etched while the AlGaAs release layer would be.

FIG. 5H illustrates the process of depositing top electrodes and anti-reflection coating layers. Top electrodes (108) can be deposited on the first side of the top GaInP cell (107). A GaAs contact layer (not shown) can be deposited between the top electrodes (108) and the window layer (106) to help form Ohmic contacts between the top cell and the top electrodes. Examples of top electrodes include (but are not limited to) AuPdGe. The AuPdGe top electrodes can be formed at a low temperature of about 140° C. or lower to minimize the thermal stresses on the bottom metal electrodes, the middle metal electrodes, and the mechanical handle layers. After metallization the remaining GaAs contact layer can be etched with a phosphoric etch. In some embodiments, at least one anti-reflection coating (130) can be deposited. An example of anti-reflection coating can be 25 nm $TiO_2$, 25 nm $Si_3N_4$, 75 nm $SiO_2$, and the combinations thereof.

Figure 6B:
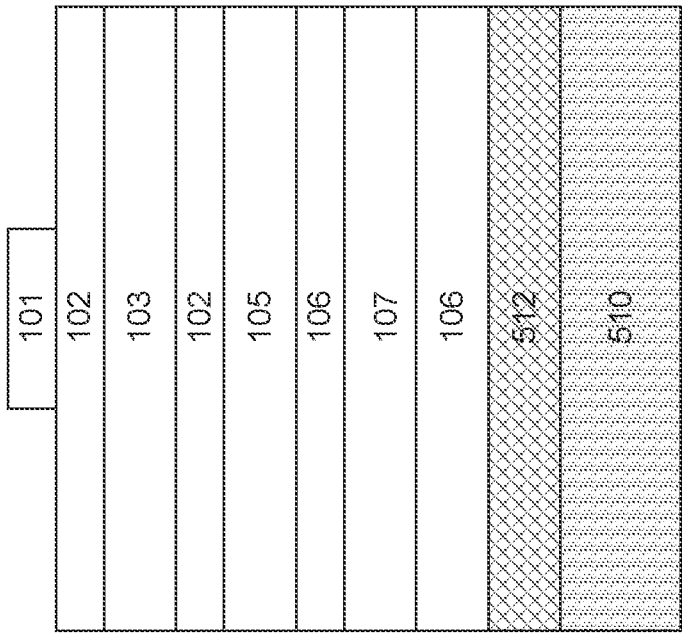
FIGS. 6A-6H illustrate an alternative step by step fabrication process of manufacturing a three-terminal tandem solar cell in accordance with an embodiment of the invention.
Figure 6A:
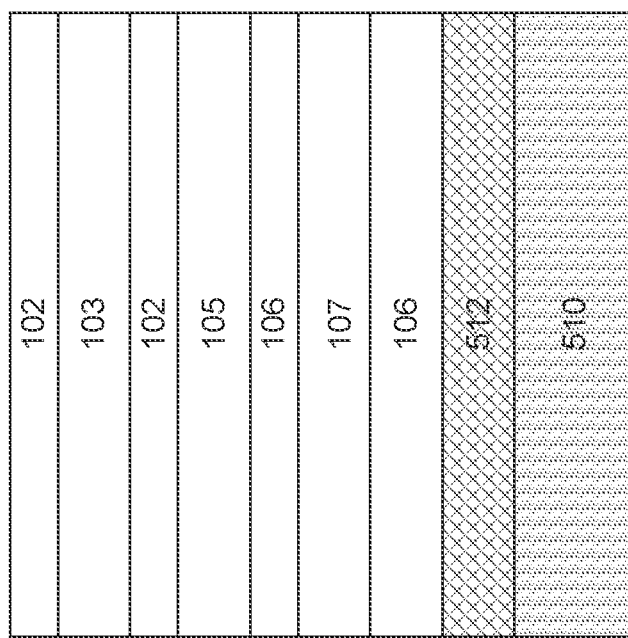

FIG. 6A-FIG. 6H illustrate a step by step fabrication process of manufacturing a three-terminal tandem solar cell in accordance with an embodiment of the invention. In FIG. 6A, a stack of tandem solar cell materials is grown on a GaAs wafer substrate (510) in an upside-down order. An AlGaAs release layer (512) is deposited in between the stack of tandem cell materials and the GaAs substrate (510). The stack of tandem cell materials includes the GaInP top cell (107) and the AlInP layers (106) as the corresponding window and/or bsf layers, the central transparent conductor AlGaAs layer (105), the GaAs bottom cell (103), the GaInP layers or the AlGaAs layers (102) as the corresponding widow and/or bsf layers.

FIG. 6B illustrates the formation of GaAs metallization. Bottom electrodes (101) can be deposited on the window layer of the GaAs bottom cell. The bottom electrodes (101) can be n-type contact pads. A GaAs contact layer (not shown) can be deposited between the bottom electrodes (101) and the window layer (102) to help form Ohmic contacts between the bottom cell and the bottom electrodes. Examples of metallurgies include (but are not limited to) AuGeNi, CuGe, and PdGe. The electrodes can be deposited using shadow mask and/or lithography techniques.

Figure 6D:
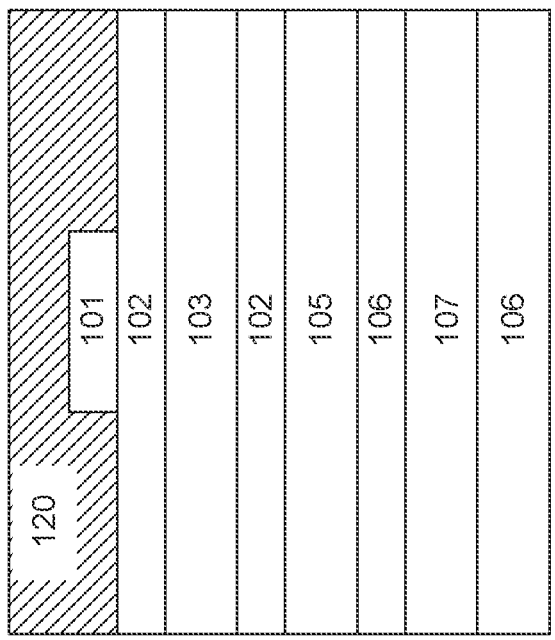
Figure 6C:
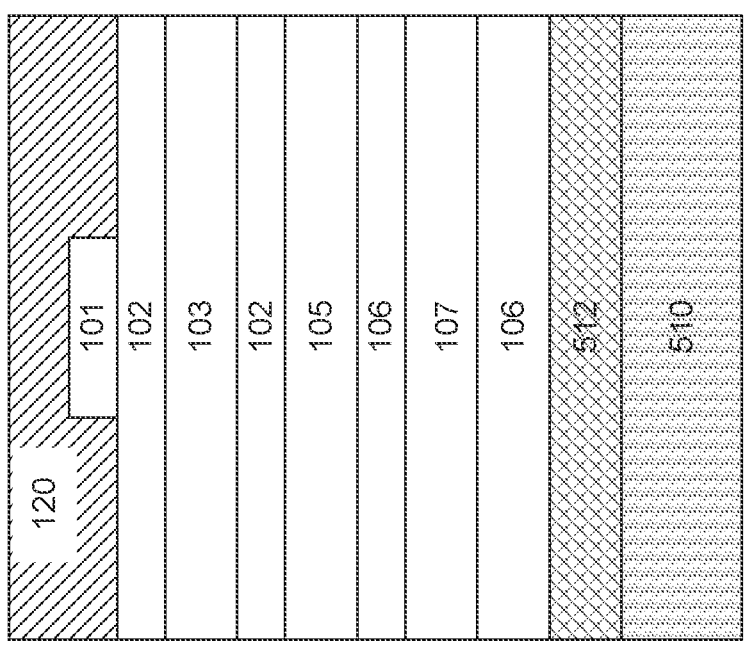

FIG. 6C illustrates the process of applying a mechanical support handle layers to the thin film based three-terminal tandem solar cell. Mechanical support handle layer (120) can be deposited to help support the thin-film solar cell. The mechanical support handle layer (120) covers the bottom electrodes (101) and the bottom cell (103) and the corresponding widow layers (102). Examples of the mechanical handle layers include (but are not limited to) solution processable polyimide and silicone. Certain embodiments implement Nexolve CP1 as the mechanical handle layer. A number of embodiments implement Sylgard 184 as the mechanical handle layer.

FIG. 6D illustrates the process of removing the wafer substrate. The tandem solar cell can be removed from the wafer substrate (510) it is grown on. This can be accomplished by etching the AlGaAs release layer (512). An example of the etchant can be HF. Many embodiments provide that the aluminum fraction (x) of the central transparent conductor $Al_xGa_{1-x}As$ layer has been chosen so that the central transparent conductor layer will not be rapidly etched while the AlGaAs release layer would be.

Figure 6F:
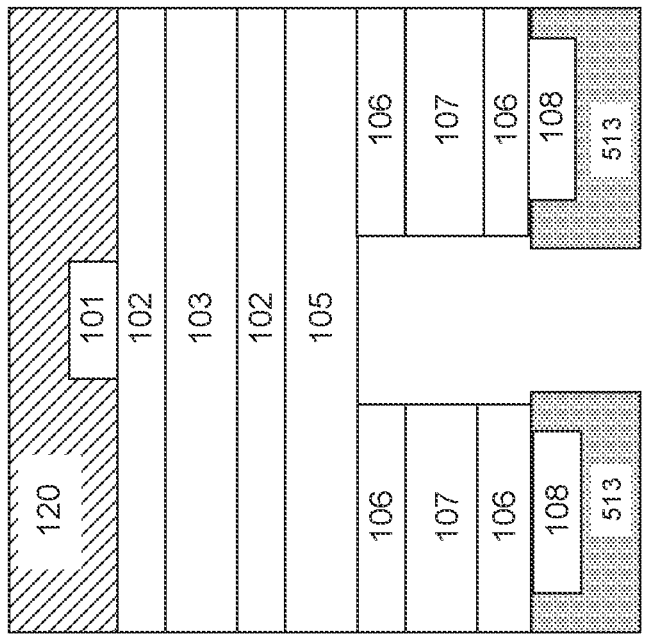
Figure 6E:
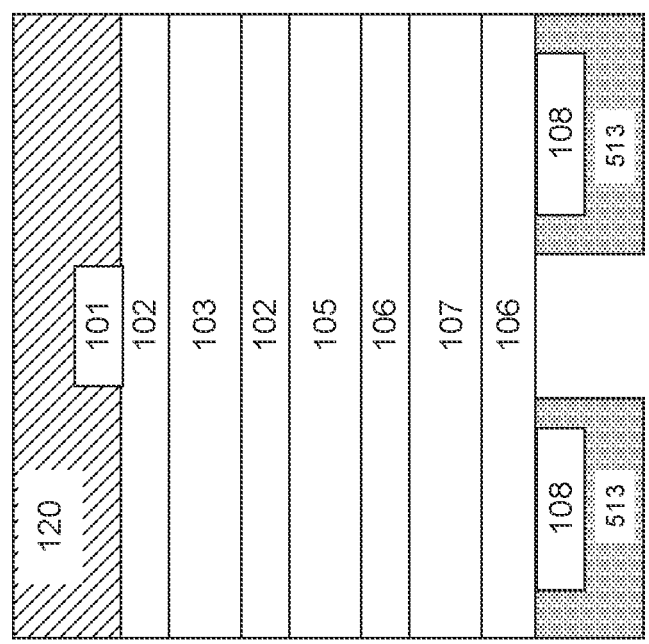

FIG. 6E illustrates the process of depositing the top electrodes and lithographically defining the middle contact area. Top electrodes (108) can be deposited on the first side of the top GaInP cell (107). A GaAs contact layer (not shown) can be deposited between the top electrodes (108) and the window layer (106) to help form Ohmic contacts between the top cell and the top electrodes. Examples of top electrodes include (but are not limited to) AuPdGe. The AuPdGe top electrodes can be formed at a low temperature of about 140° C. or lower to minimize the thermal stresses on the bottom metal electrodes, the middle metal electrodes, and the mechanical handle layers. After metallization the remaining GaAs contact layer can be etched with a phosphoric etch.

The stack of materials can be photolithographically patterned with slits. The region that will be etched for the middle electrodes layer can be defined using lithography. The photomask (513) can be deposited on the top electrodes and covers the three sides of the top electrodes (108). The photomask (513) can protect the top electrodes during the following etching step, and define the region for the middle electrodes. The GaInP top cell (107) and the corresponding window layers (106) that are not protected by the photomask may be etched away to form the region to deposit the middle electrodes. The slits of the photomask should have a distance (a) such that there will be a gap between the GaInP cell and the middle electrodes. In some embodiments, the distance a can be about at least 10 microns.

FIG. 6F illustrates an etch process to define the regions for middle electrodes. The photolithographically patterned stack can then be etched with an etchant to leave a trench undercutting the photoresist that can have metal contacts evaporate into, forming the middle electrodes. In some embodiments, the stack can be etched down to the central transparent contact layer (105). The etching process can be controlled because the phosphides can be etched by undissociated HCl while arsenides may not. An example of phosphide etch can be 1 molar HCl in acetic acid made by diluting aqueous HCl in acetic acid. The acetic acid may be important for reducing the etch rate to a reasonable rate, given that pure HCl may etch InP at a rate of greater than 3 microns/min.

Figure 6H:
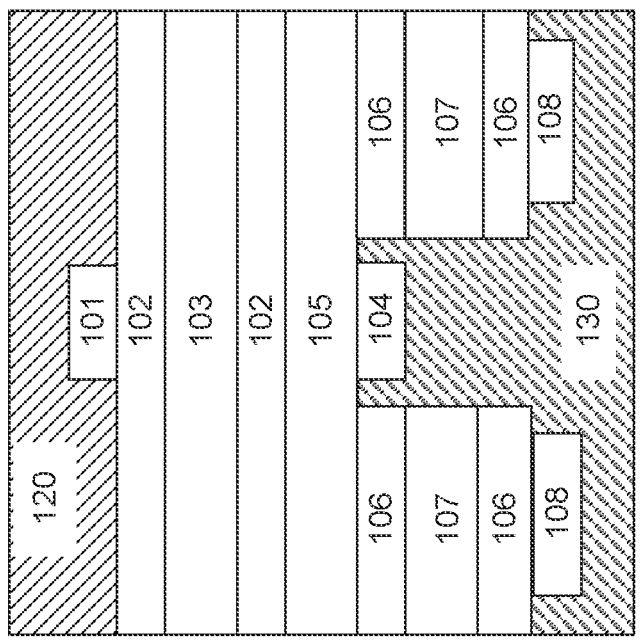
Figure 6G:
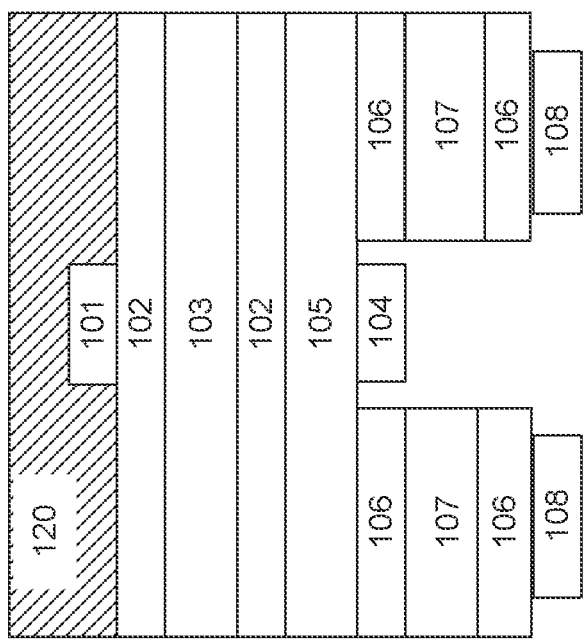

FIG. 6G illustrates the process of depositing the middle electrodes and lifting off the photomask. The middle electrodes (104) can be deposited and form Ohmic contacts to the transparent conductor layer (105). The transparent conductor layer can be a heavily-doped p-type AlGaAs layer, and it can form Ohmic contacts with metal contacts relatively easily. Examples of middle electrodes include (but are not limited to) gold, silver, AuZn and Ti/Pt/Au. The photoresist masks (513) can then be dissolved, removing the excess metal. Special attention may be needed to make sure metal does not get on the sidewalls of the etched trench which may shunt the cell. This can be avoided by performing the etches such that they undercut the resist.

FIG. 6H illustrates the process of depositing anti-reflection coating layers. In some embodiments, at least one anti-reflection coating (130) can be deposited. An example of anti-reflection coating can be 25 nm $TiO_2$, 25 nm $Si_3N_4$, 75 nm $SiO_2$, and the combinations thereof.

While various fabrication processes to manufacture three-terminal tandem solar cells are described above with references to FIG. 5A-FIG. 5H, and FIG. 6A-FIG. 6H, any variety of three-terminal tandem solar cell fabrication processes can be utilized as appropriate to the requirements of specific applications in accordance with various embodiments of the invention. Performance of three-terminal tandem solar cells in accordance with various embodiments of the invention are discussed further below.

Performance of Three Terminal Tandem Solar Cells

Many embodiments provide simulated performance of the three-terminal tandem solar cells. Some embodiments implement device simulators such as Sentaurus Device to simulate the optoelectronic performance of the tandem cells. The efficiency of the three-terminal tandem solar cells ranges from about 30% to about 35.3%. In some embodiments, the device efficiency is about 30.2% or about 34% when correcting for shading losses.

FIG. 7A illustrates a tandem cell structure that is used in the simulation process in accordance with an embodiment of the invention. The tandem solar cell structure in FIG. 7A is illustrated upside down. The tandem solar cell has a 25 nm $TiO_2$, 25 nm $Si_3N_4$, 75 nm $SiO_2$ anti-reflection layer; a 50 nm 5E19 n-type GaAs contact layer; a 30 nm 1E18 n-type AlInP and a 5 nm undoped AlInP window layer; a GaInP top cell including a 75 nm 1E18 n-type GaInP, a 2.75 micron undoped GaInP, and a 75 nm 1E18 p-type GaInP; a 5 nm undoped AlInP and a 250 nm 1E18 p-type AlInP window layer; a 300 nm 1E20 p-type AlGaAs transparent conductor layer; a 20 nm 1E18 p-type GaInP and 5 nm undoped GaInP window layer; a GaAs bottom cell including a 75 nm 1E18 p-type GaAs, a 1.75 micron undoped GaAs, and a 75 nm 1E18 n-type GaAs; a 5 nm undoped GaInP and a 20 nm 1E18 n-type GaInP window layer; and a 50 nm 5E18 n-type GaAs contact layer. The tandem solar cell shows an efficiency of about 35.3%.

Figure 7B:
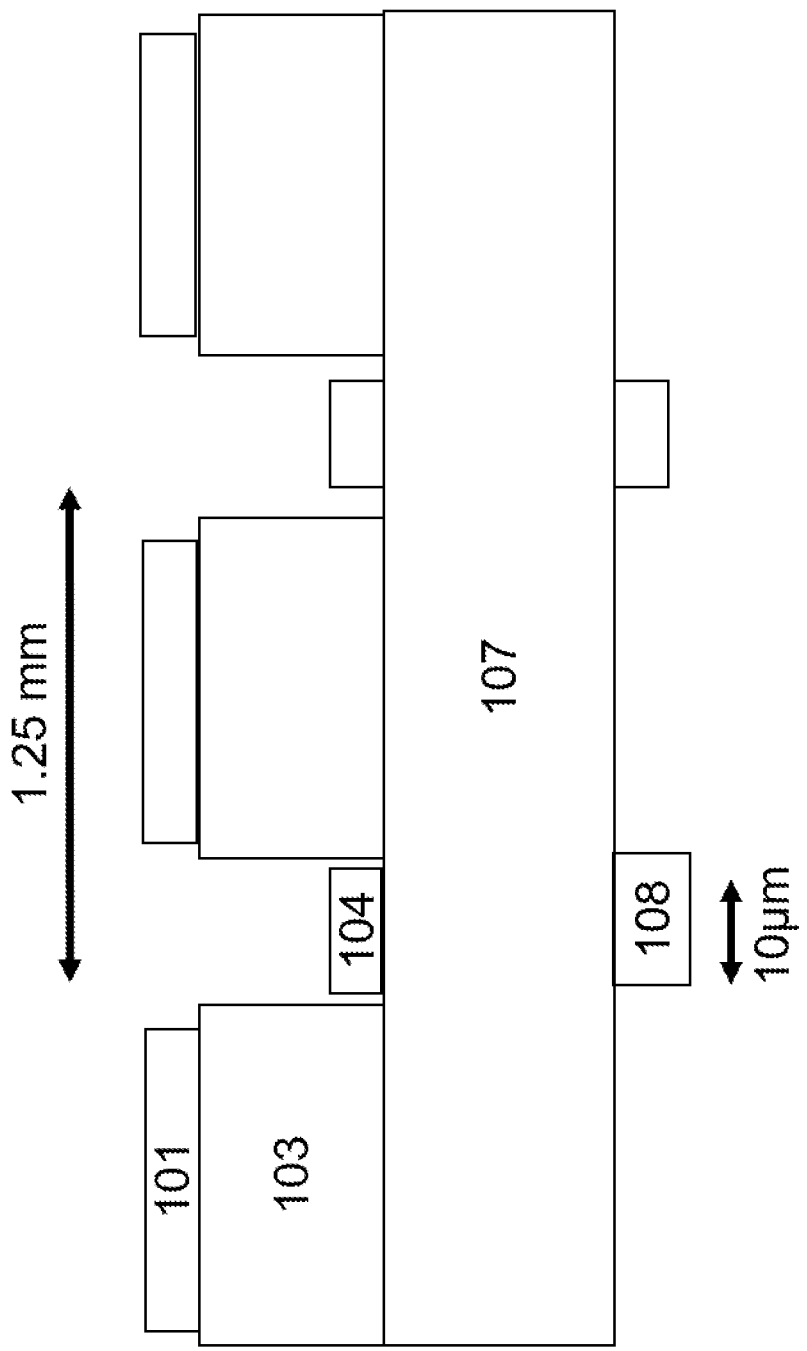

FIG. 7B illustrates the device geometry of the tandem solar cell that is simulated in FIG. 7A in accordance with an embodiment of the invention. The width of the top electrodes (108) is about 10 microns. The distance from the middle electrode (104) to the bottom cell (103) is about 1.25 mm.

DOCTRINE OF EQUIVALENTS

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A three-terminal tandem solar cell, comprising:
   at least one top cell;
   at least one window layer on a first side of the top cell and at least one window layer on a second side of the top cell, wherein the second side is on the opposite side of the first side of the top cell;

at least one transparent conductor layer, wherein the at least one transparent conductor layer is deposited on the at least one window layer on the second side of the top cell;

at least one bottom cell;

at least one window layer on a first side of the bottom cell and at least one window layer on a second side of the bottom cell, wherein the second side is on the opposite side of the first side of the bottom cell, wherein the at least one widow layer on the first side of the bottom cell is deposited on the at least one transparent conductor layer;

at least one top electrode on the at least one window layer on the first side of the top cell;

at least one bottom electrode on the at least one window layer on the second side of the bottom cell; and at least one middle electrode on the at least one transparent conductor layer, wherein the at least one window layer on the second side of the top cell and the at least one middle electrode are alternatively arranged on the at least one transparent conductor layer.

2. The three-terminal tandem solar cell of claim 1, wherein the at least one top cell comprises at least one layer of undoped GaInP, at least one layer of p-type doped GaInP, and at least one layer of n-type doped GaInP, wherein the at least one top cell has a thickness of at least 2.75 microns.

3. The three-terminal tandem solar cell of claim 1, wherein the at least one window layer on the first side of the top cell comprises at least one layer of undoped AlInP, and at least one layer of n-type doped AlInP.

4. The three-terminal tandem solar cell of claim 1, wherein the at least one window layer on the second side of the top cell comprises at least one layer of undoped AlInP, and at least one layer of p-type doped AlInP.

5. The three-terminal tandem solar cell of claim 1, wherein the transparent conductor layer comprises $Al_xGa_{1-x}As$, wherein x is about 0.4.

6. The three-terminal tandem solar cell of claim 1, wherein the at least one bottom cell comprises at least one layer of undoped GaAs, at least one layer of p-type doped GaAs, and at least one layer of n-type doped GaAs, wherein the at least one top cell has a thickness of at least 1.75 microns.

7. The three-terminal tandem solar cell of claim 1, wherein the at least one window layer on the first side of the bottom cell comprises at least one layer of undoped GaInP, and at least one layer of p-type doped GaInP.

8. The three-terminal tandem solar cell of claim 1, wherein the at least one window layer on the second side of the bottom cell comprises at least one layer of undoped GaInP, and at least one layer of n-type doped GaInP.

9. The three-terminal tandem solar cell of claim 1, wherein the top electrode comprises AuPdGe.

10. The three-terminal tandem solar cell of claim 1, wherein the middle electrode comprises gold, silver, AuZn, or Ti/Pt/Au.

11. The three-terminal tandem solar cell of claim 1, wherein the bottom electrode comprises AuGeNi, CuGe, or PdGe.

12. The three-terminal tandem solar cell of claim 1, further comprising a first contact layer between the at least one window layer on the first side of the top cell and the at least one top electrode, a second contact layer between the at least one window layer on the second side of the bottom cell and the at least one bottom electrode.

13. The three-terminal tandem solar cell of claim 1, further comprising an anti-reflection layer covering the at least one window layer on the first side of the top cell and the at least one top electrode.

14. The three-terminal tandem solar cell of claim 1, further comprising a mechanical handle layer covering the at least one window layer on the second side of the bottom cell and the at least one bottom electrode.

15. The three-terminal tandem solar cell of claim 12, wherein the first contact layer comprises GaAs, and the second contact layer comprises GaAs.

16. The three-terminal tandem solar cell of claim 13, wherein the anti-reflection layer comprises $TiO_2$, $Si_3N_4$, $SiO_2$, and any combinations thereof.

17. The three-terminal tandem solar cell of claim 14, wherein the mechanical handle layer comprises a polyimide or a silicone.

18. A method of fabricating a three-terminal tandem solar cell comprising:

providing a wafer substrate;

depositing a release layer on one side of the wafer substrate, wherein the release layer comprises $Al_xGa_{1-x}As$ and x is greater than 0.6;

growing a stack of tandem solar cell on the release layer, wherein the stack comprising:

at least one top cell;

at least one window layer on a first side of the top cell and at least one window layer on a second side of the top cell, wherein the second side is on the opposite side of the first side of the top cell;

at least one transparent conductor layer, wherein the at least one transparent conductor layer is deposited on the at least one window layer on the second side of the top cell;

at least one bottom cell;

at least one window layer on a first side of the bottom cell and at least one window layer on a second side of the bottom cell, wherein the second side is on the opposite side of the first side of the bottom cell, wherein the at least one widow layer on the first side of the bottom cell is deposited on the at least one transparent conductor layer;

depositing at least one bottom electrode on the at least one window layer on the second side of the bottom cell;

coating a photomask with at least one slit on the at least one bottom electrode;

etching the at least one bottom cell and the window layers on the first and second side of the bottom cell through the at least one slit of the photomask;

depositing at least one middle electrode on the at least one transparent conductor layer, wherein the at least one window layer on the second side of the top cell and the at least one middle electrode are alternatively arranged on the at least one transparent conductor layer;

removing the photomask;

depositing a mechanical handle layer covering the at least one bottom electrode, the at least one middle electrode and the bottom cell;

etching the release layer to remove the wafer substrate; and, depositing at least one top electrode on the at least one window layer on the first side of the top cell.

19. The method of claim 18, further comprising depositing an anti-reflection layer covering the at least one top electrode and the at least one window layer on the first side of the top cell.

20. The method of claim 18, further comprising depositing a contact layer on the at least one window layer on the first side of the top cell before depositing the at least one top electrode.

21. The method of claim 20, further comprising etching the contact layer after depositing the at least one top electrode.

22. The method of claim 18, wherein the stack of tandem solar cell is grown on the release layer via metalorganic chemical vapor deposition, hydride vapor phase epitaxy, liquid phase epitaxy, or molecular beam epitaxy.

23. The method of claim 18, wherein an etchant for the etching of the release layer is HF.

24. The method of claim 18, wherein the deposition of the at least one bottom electrode is via shadow mask or photolithography.

* * * * *